(12) United States Patent
Wakabayashi et al.

(10) Patent No.: US 7,190,064 B2
(45) Date of Patent: Mar. 13, 2007

(54) SEMICONDUCTOR DEVICE AND METHOD OF MANUFACTURING THE SAME

(75) Inventors: Takeshi Wakabayashi, Sayama (JP); Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 21 days.

(21) Appl. No.: 10/472,803

(22) PCT Filed: Feb. 3, 2003

(86) PCT No.: PCT/JP03/01061

§ 371 (c)(1),
(2), (4) Date: Sep. 23, 2003

(87) PCT Pub. No.: WO03/067648

PCT Pub. Date: Aug. 14, 2003

(65) Prior Publication Data
US 2005/0098891 A1 May 12, 2005

(30) Foreign Application Priority Data
Feb. 4, 2002 (JP) ............... 2002-026808
Apr. 19, 2002 (JP) ............... 2002-117307

(51) Int. Cl.
*H01L 23/52* (2006.01)

(52) U.S. Cl. .................................................. 257/691

(58) Field of Classification Search ........ 257/734–738, 257/700–707, 774, 678–691
See application file for complete search history.

(56) References Cited

U.S. PATENT DOCUMENTS

| 5,111,278 A | | 5/1992 | Eichelberger |
| 5,841,193 A | | 11/1998 | Eichelberger |
| 6,140,155 A | * | 10/2000 | Mihara et al. ............... 438/124 |
| 6,154,366 A | * | 11/2000 | Ma et al. ..................... 361/704 |

(Continued)

FOREIGN PATENT DOCUMENTS

EP 2000-124354 4/2000

(Continued)

OTHER PUBLICATIONS

Japanese Office Action (Notification of Reasons for Rejection) mailed Dec. 20, 2005 in a counterpart Japanese patent application, and English translation thereof.

*Primary Examiner*—Nathan W. Ha
(74) *Attorney, Agent, or Firm*—Frishauf, Holtz, Goodman & Chick, PC

(57) ABSTRACT

A plurality of semiconductor chips (23) are bonded to an adhesive layer (22) formed on a base plate (21). Then, first to third insulating films (31, 35, 39), first and second underlying metal layers (33, 37), first and second re-wirings (34, 38), and a solder ball (41) are collectively formed for the plural semiconductor chips (23). In this case, the first and second underlying metal layers (33, 37) are formed by a sputtering method, and the first and second re-wirings (34, 38) are formed by an electroplating method. Then, a laminate structure consisting of the three insulating films (39, 35, 31), the adhesive layer (22), and the base plate (21) is cut in a region positioned between the adjacent semiconductor chips (23).

13 Claims, 45 Drawing Sheets

U.S. PATENT DOCUMENTS

| | | | |
|---|---|---|---|
| 6,271,469 B1 * | 8/2001 | Ma et al. | 174/521 |
| 6,545,354 B1 * | 4/2003 | Aoki et al. | 257/734 |
| 6,590,291 B2 * | 7/2003 | Akagawa | 257/774 |
| 6,674,162 B2 * | 1/2004 | Takao | 257/700 |
| 6,720,644 B2 * | 4/2004 | Yoshizawa et al. | 257/692 |
| 6,765,299 B2 * | 7/2004 | Takahashi et al. | 257/777 |
| 6,870,256 B2 * | 3/2005 | Aoki et al. | 257/700 |
| 2002/0017730 A1 * | 2/2002 | Tahara et al. | 257/786 |
| 2002/0084522 A1 * | 7/2002 | Yoshizawa et al. | 257/692 |
| 2003/0122244 A1 * | 7/2003 | Lin et al. | 257/700 |
| 2003/0197285 A1 * | 10/2003 | Strandberg et al. | 257/778 |
| 2003/0230804 A1 * | 12/2003 | Kouno et al. | 257/734 |
| 2004/0046254 A1 * | 3/2004 | Lin et al. | 257/734 |
| 2004/0195686 A1 * | 10/2004 | Jobetto et al. | 257/734 |

FOREIGN PATENT DOCUMENTS

| | | |
|---|---|---|
| EP | 2001-168231 | 6/2001 |
| EP | 2001-217381 | 8/2001 |
| EP | 1 137 066 A2 | 9/2001 |
| JP | 9-266183 | 10/1997 |
| JP | 11-233678 | 8/1999 |
| JP | 2001-144121 A | 5/2001 |
| JP | 2001-320015 | 11/2001 |
| JP | 2001-332643 | 11/2001 |
| JP | 2002-246504 | 8/2002 |
| JP | 2002-246758 | 8/2002 |

* cited by examiner

SEMICONDUCTOR DEVICE AND METHOD OF MANUFACTURING THE SAME

TECHNICAL FIELD

The present invention relates to a semiconductor device and a method of manufacturing the same, particularly, to a semiconductor device in which a re-wiring is formed directly on one surface of a semiconductor chip like a chip size package (CSP) and a method of manufacturing the same.

BACKGROUND ART

A conventional semiconductor device called, for example, a BGA (ball grid array) includes a device in which a semiconductor chip made of, for example, an LSI is mounted in the central portion on the upper surface of a relay substrate (interposer) sized somewhat larger than the semiconductor chip, and connection terminals formed of solder balls are arranged to form a matrix on the lower surface of the relay substrate.

FIG. 45 is a vertical cross sectional view exemplifying the construction of such a conventional semiconductor device. As shown in the figure, a semiconductor chip 1 includes a silicon substrate 2 and a plurality of bump electrodes 3 made of, for example, copper and formed on the lower surface of the silicon substrate 2. A relay substrate 4 is equipped with a base film 5 having a planar size somewhat larger than the planar size of the silicon substrate 2 of the semiconductor chip 1. A plurality of re-wirings 6 electrically connected to the bump electrodes 3 of the semiconductor chip 1 are formed on the upper surface of the base film 5. The re-wirings 6 includes first connection pads 7 arranged to correspond to the bump electrodes 3 of the semiconductor chip 1, second connection pads 8 arranged to form a matrix, and connecting lines 9 serving to electrically connect the first and second connection pads 7 and 8. Further, a circular hole 10 is formed in that portion of the base film 5 which corresponds to the central portion of the second connection pad 8.

The semiconductor chip 1 is bonded to the central portion on the upper surface of the relay substrate 4 with an anisotropic conductive adhesive layer 11 interposed therebetween. The anisotropic conductive adhesive layer 11 includes a thermosetting resin 12 and a large number of conductive particles 13 contained in the thermosetting resin 12.

In mounting the semiconductor chip 1 to the relay substrate 4, the semiconductor chip 1 is simply positioned first in the central portion on the upper surface of the relay substrate 4 with the anisotropic conductive adhesive layer 11 interposed therebetween. Then, a prescribed pressure is applied to the semiconductor chip 1 at the temperature at which the thermosetting resin 12 is cured so as to achieve the bonding between the semiconductor chip 1 and the relay substrate 4. As a result, the bump electrode 3 pushes away the thermosetting resin 12 so as to be electrically connected to the upper surface of the first connection pad 7 with the conductive particles 13 interposed therebetween. In addition, the lower surface of the semiconductor chip 1 is bonded to the upper surface of the relay substrate 4 with the thermosetting resin 12 interposed therebetween.

In the next step, a resin sealing film 14 made of an epoxy resin is formed on the entire upper surface of the relay substrate 4 including the semiconductor chip 1, followed by allowing a solder ball 15 to be connected to the second connection pad 8 within and below the circular hole 10. In this case, a plurality of solder balls 15 are arranged to form a matrix because the second connection pads 8 are arranged to form a matrix. It should be noted that the solder ball 15 has a diameter larger than that of the bump electrode 3 of the semiconductor chip 1. Therefore, in order to avoid the mutual contact of the solder balls 15, it is necessary for the solder balls 15 to be arranged such that the distance between the adjacent solder balls 15 is larger than the distance between the adjacent bump electrodes 3. Such being the situation, where the number of bump electrodes 3 of the semiconductor chip 1 is increased, it is necessary to make the arranging region of the bump electrodes 3 larger than the size of the semiconductor chip 1 in order to obtain the arrangement space required for each of the solder balls 15. Therefore, the size of the relay substrate 4 is made somewhat larger than the size of the semiconductor chip 1. It follows that the solder balls 15 positioned in the peripheral portion of the matrix arrangement of the solder balls 15 are arranged in the periphery of the semiconductor chip 1.

As described above, in the conventional semiconductor device in which the connection terminals formed of the solder balls 15 are also arranged in the periphery of the semiconductor chip 1, the lower surfaces of the bump electrodes 3 of the semiconductor chip 1 are electrically connected by the bonding method using the relay substrate 4 having the re-wirings 6 formed thereon to the upper surfaces of the first connection electrodes 7 of the re-wirings 6 of the relay substrate 4 with the conductive particles 13 contained in the anisotropic conductive adhesive layer 11 interposed therebetween. The particular construction gives rise to the problem that it is possible for the defective connection to take place depending on the state of the bonding. Also, it is necessary to mount the semiconductor chips 1 one by one to the relay substrate 4 so as to make the manufacturing process troublesome. The particular situation also takes place in the case of a semiconductor device of a multi-chip module type comprising a plurality of semiconductor chips. Particularly, in the case of a multi-chip module type semiconductor device, the semiconductor device is provided in many cases with chip parts such as a capacitor, an inductor and a resistor in addition to the plural semiconductor chips. What should be noted is that the bonding process is rendered more complex if the shapes and thicknesses of the semiconductor chips and the chip parts differ from each other.

DISCLOSURE OF INVENTION

An object of the present invention is to provide a semiconductor device comprising connection terminals formed in a periphery of a semiconductor chip and permitting electrically connecting the semiconductor chip to a re-wiring without fail without using a relay substrate and a method of manufacturing the particular semiconductor device.

Another object of the present invention is to provide a method of manufacturing a semiconductor device, which permits collectively manufacturing a plurality of semiconductor devices.

According to a first aspect of the present invention, there is provided a semiconductor device comprising at least one semiconductor chip having connection pads formed on an upper surface thereof, an insulating film having at least one layer formed to cover the upper surface and a peripheral surface of the semiconductor chip, and re-wirings formed on an upper surface of the insulating film in a manner to be connected to the connection pads of the semiconductor chip, wherein at least some of the re-wirings include pad portions arranged in a region of the insulating film, outside periphery of the semiconductor chip.

Further, according to a second aspect of the present invention, there is provided a method of manufacturing a semiconductor device comprising providing a base plate; mounting a plurality of semiconductor chips each having a plurality of connection pads formed on an upper surface thereof to the base plate, the plural semiconductor chips being mounted apart from each other; forming an insulating film on an upper surface of the base plate including the upper surfaces of the semiconductor chips such that the insulating film has a flat surface; forming a plurality of pairs of re-wirings on the insulating film, each of the re-wirings being connected to the connection pad of any of the semiconductor chips and at least some of the re-wirings having pad portions arranged in a region of the insulating film formed in the periphery of the semiconductor chip connected to the connection pad; and cutting the insulating film between the adjacent semiconductor chips so as to obtain a plurality of semiconductor devices each comprising at least one semiconductor chip, the insulating film formed in the periphery of the semiconductor chip, and a re-wiring having a pad portion arranged in the region of the insulating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF DRAWINGS

The accompanying drawings, which are incorporated in and constitute a part of the specification, illustrate embodiments of the invention, and together with the general description given above and the detailed description of the embodiments given below, serve to explain the principles of the invention.

BEST MODE FOR CARRYING OUT THE INVENTION (First Embodiment)

Figure 1:
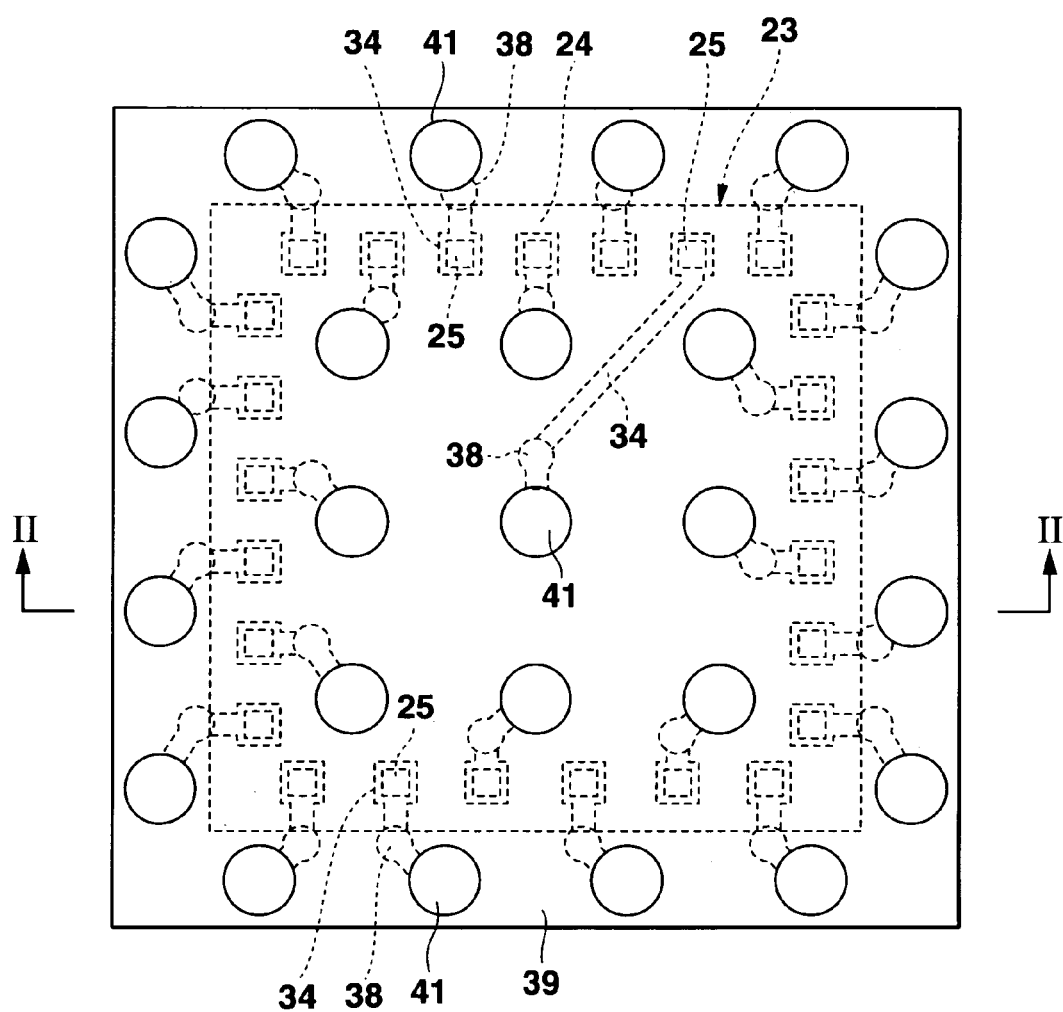
FIG. 1 is a plan view showing in a magnified fashion a semiconductor device according to a first embodiment of the present invention.
Figure 2:
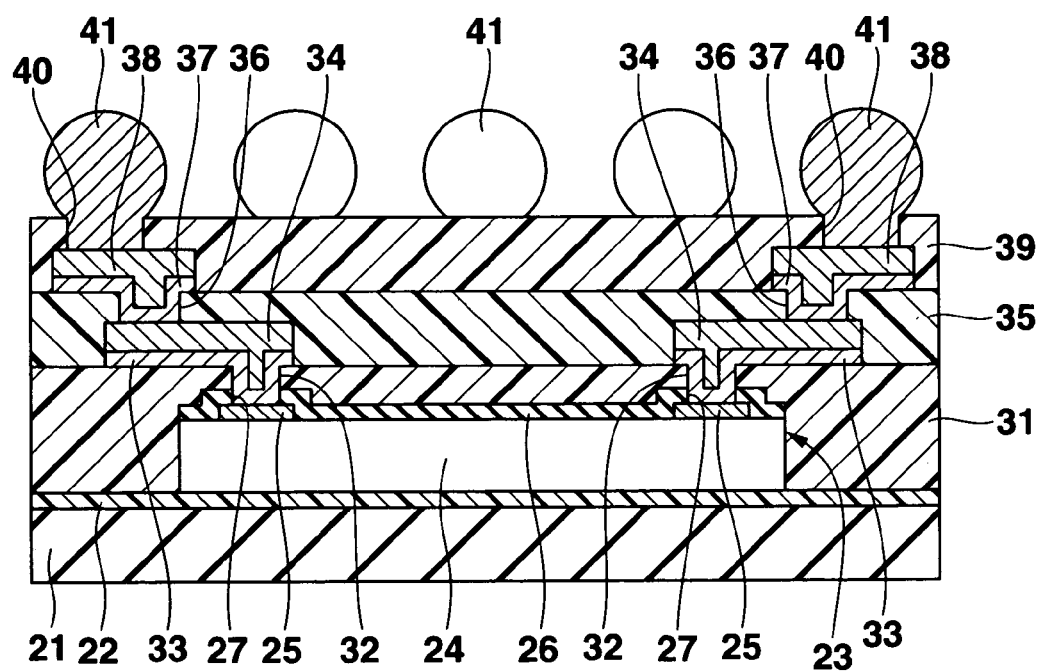
FIG. 2 is a cross sectional view showing in a magnified fashion the semiconductor device shown in FIG. 1 along the line II—II shown in FIG. 1.

FIG. 1 is a plan view showing a semiconductor device according to a first embodiment of the present invention, and FIG. 2 is a cross sectional view along the line II—II shown in FIG. 1. In this case, FIGS. 1 and 2 are not equal to each other in the size of each member of the semiconductor device.

The semiconductor device comprises a base plate 21 having a square planar shape and made of, for example, a resin plate, a metal plate or glass plate. An adhesive layer 22 made of, for example, an adhesive, an adhesive sheet or a double-coated adhesive tape is formed on the entire upper surface of the base plate 21. The lower surface of a silicon substrate 24 of a substantially square semiconductor chip 23 sized somewhat smaller than the base plate 21 is mounted on the central portion of the upper surface of the adhesive layer 22.

The semiconductor chip 23 includes a plurality of connection pads 25 made of, for example, aluminum and mounted to the upper peripheral portion of the silicon substrate 24, an insulating film 26 made of an inorganic material such as silicon oxide and formed to cover the connection pad 25 except the central portion of the connection pad 25 and to cover the entire upper surface of the silicon substrate 24, and an open portion 27 formed in the insulating film 26 for exposing the central portion of the connection pad 25 to the outside.

The adhesive layer 22 is made of a resin that is generally known to the art as a die-bond material such as an epoxy resin or a polyimide resin and serve to permit the semiconductor chip 23 to be bonded to the base plate 21 when the semiconductor chip 23 is pressurized under heating. A first insulating film 31 made of an organic material such as polyimide or an epoxy-based resin is formed on the entire upper surface of the adhesive layer 22 including the semiconductor chip 23 such that the upper surface of the first insulating film 31 is planarized. In this case, an open portion 32 is formed in that portion of the first insulating film 31 which corresponds to the open portion 27 of the semiconductor chip 23. Also, a first underlying metal layer 33 is formed to extend from the upper surface of the connection pad 25 exposed to the outside through the open portions 27, 32 to a prescribed portion on the upper surface of the first insulating film 31. Further, a first re-wiring 34 is formed on the entire upper surface of the first underlying metal layer 33.

A second insulating film 35 made of an organic material such as polyimide or an epoxy-based resin is formed on the entire upper surface of the first insulating film 31 including the first re-wiring 34 such that the upper surface of the second insulating film 35 is planarized. In this case, an open portion 36 is formed in that portion of the first re-wiring 34 in the second insulating film 35 which is shifted from the connection pad 25 or in the pad portion. Also, a second underlying metal layer 37 is formed to extend from the upper surface of the first re-wiring 34 exposed to the outside through the open portion 36 to reach a prescribed portion on the upper surface of the second insulating film 35.

A third insulating film 39 made of an organic material such as polyimide or an epoxy-based resin is formed on the entire upper surface of the second insulating film 35 including the second re-wiring 38 such that the upper surface of the third insulating film 39 is planarized. In this case, an open portion 40 is formed in that portion on the second re-wiring 38 of the third insulating film 39 which is shifted from the open portion 36 or in the pad portion. Also, a solder ball 41 is formed within and above the open portion 40 so as to be electrically connected to the pad portion of the second re-wiring 38. As shown in FIG. 1, a plurality of solder balls 41 are arranged to form a matrix.

It is important for the planar size (area of the rectangular upper surface) of the base plate 21 to be larger than the planar size of the semiconductor chip 23. Where the base plate 21 is sized larger than the semiconductor chip 23, it is possible to make the arranging region of the solder balls 41 larger than the planar size of the semiconductor chip 23 so as to increase the arranging pitch and the size of the solder balls. It follows that, even if the number of connection pads 24 included in the semiconductor chip 23 is increased, it is possible to set the arranging pitch and size of the solder balls 41 as desired so as to ensure the reliability of the bonding.

Under the circumstances, at least the solder balls 41 in the outermost periphery among the solder balls 41 arranged to form a matrix are positioned along the outer circumference of the region corresponding to the semiconductor chip 23.

Figure 3:
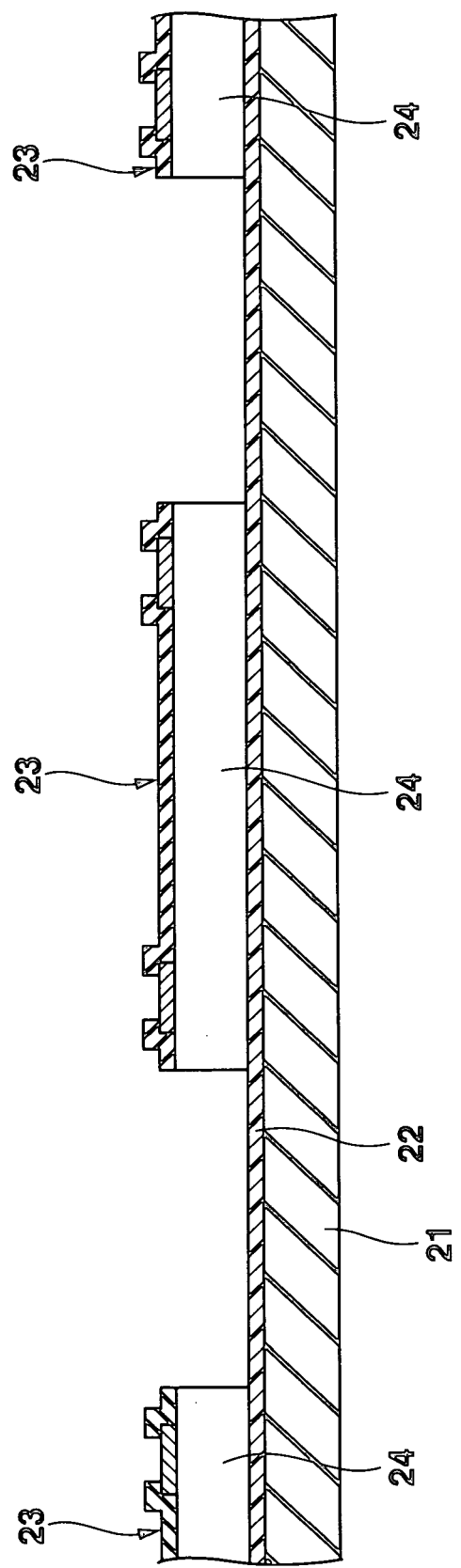
FIG. 3 is a cross sectional view showing in a magnified fashion the gist portion of the initial manufacturing step in an example of the manufacturing method of the semiconductor device shown in FIGS. 1 and 2.

An example of the method of manufacturing the semiconductor device shown in FIGS. 1 and 2 will now be described. In the first step as shown in FIG. 3, prepared is a substrate capable of including a plurality of base plates 21 shown in FIG. 2, said substrate being hereinafter referred to as "base plate 21" for the sake of convenience. An adhesive layer 22 made of a die-bond material is formed on the entire upper surface of the base plate 21. In this case, the adhesive layer 22 is prepared by disposing a die-bond sheet made of a die-bond material such as an epoxy-based resin or a polyimide-based resin on the base plate 21 and heating the die-bond sheet so as to allow the die-bond sheet to be bonded to the base plate 21 under a provisionally cured state. Alternatively, the base plate 21 is coated with a die-bond material by a suitable method such as a spin coating method, a printing method or a transfer method, followed by drying the resultant coating so as to form the adhesive layer 22. Under the particular state, the semiconductor chip 23 is disposed on the adhesive layer 22 and pressurized under heating so as to provisionally fix the semiconductor chip 23 to the adhesive layer 22. Then, the adhesive layer 22 is cured so as to permit the lower surfaces of the silicon substrates 24 of the semiconductor chips 23 to be respectively bonded to a plurality of prescribed portions on the upper surface of the base plate 21.

Figure 4:
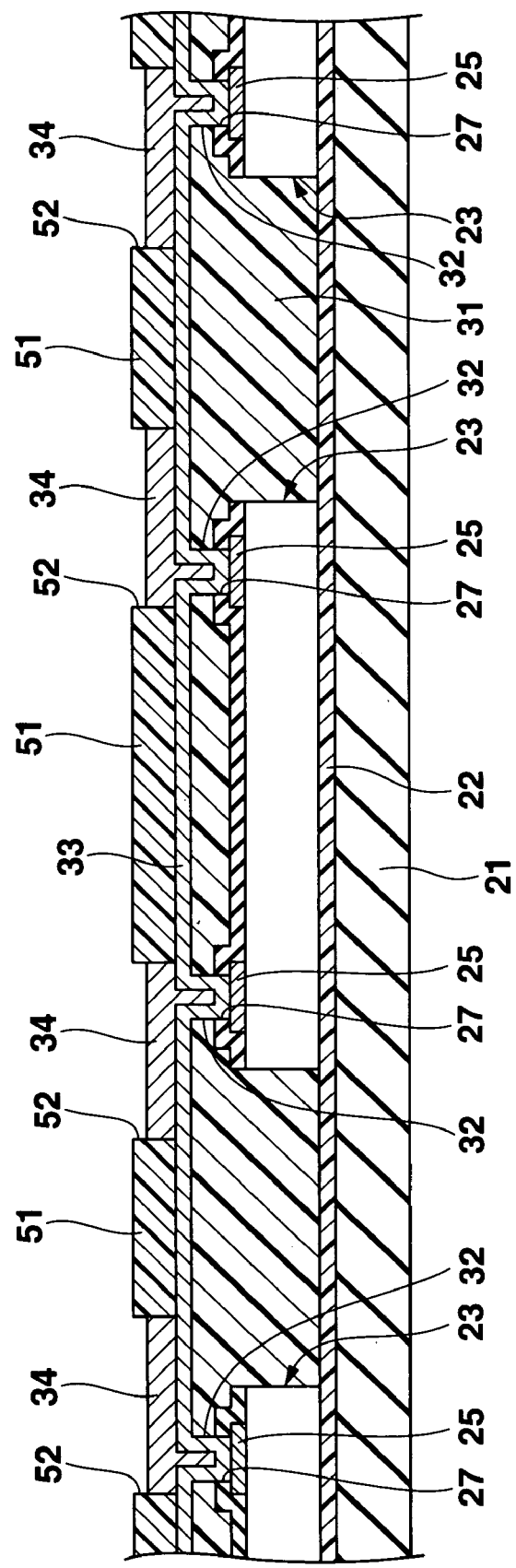
FIG. 4 is a cross sectional view showing in a magnified fashion the gist portion of the manufacturing step following the manufacturing step shown in FIG. 3.

In the next step, a first insulating film 31 made of an organic material such as polyimide or an epoxy-based resin is formed on the entire upper surface of the adhesive layer 22 including the upper surfaces of the plural semiconductor chips 23, as shown in FIG. 4. It is possible to employ a known coating method for forming the first insulating film 31. In this case, it is recommendable to employ a spin coating method or a die coating method as a desirable coating method. In the case of employing a spin coating method, a liquid die coating material is dripped first onto suitable regions on the adhesive layer 22 and/or the semiconductor chip 23, and the base plate 21 is spun so as to permit the entire surfaces of the semiconductor chips 23 and the insulating film 22 between the adjacent semiconductor chips 23 to be covered with the die coating material. Then, the die coating material is dried, and an open portion 32 is formed by a photolithography method in that portion of the first insulating film 31 which corresponds to an open portion 27 of the semiconductor chip 23, thereby forming the first insulating film 31. Alternatively, in the case of employing a die coating method, a slot die capable of ejecting a die coating material sucked by a pump is scanned so as to cover the entire surfaces of the semiconductor chips 23 and the adhesive layer 22 positioned between the adjacent semiconductor chips 23 with the die coating material, followed by forming the open portion 32. Further, it is possible to employ a screen printing method as another desirable method for forming the first insulating film 31. In the case of employing the screen printing method, the printing is performed in a manner to permit the open portion 32 to be formed in a position corresponding to the open portion 27 of each of the semiconductor chips 23. Since the particular methods described above make it possible to form the first insulating film 31 in a solid form on the upper surfaces of the semiconductor chips 23 and on the surfaces between the adjacent semiconductor chips 23 such that the first insulating film 31 thus formed has a flat upper surface, it is possible to bond all semiconductor chips 23 to the base plate 21 without fail. In order to form the insulating film uniformly and in a manner to have a flat upper surface, it is desirable for the semiconductor chip 23 to have a small thickness. Particularly, it is desirable for the semiconductor chip 23 to have a thickness of 20 to 70 μm, though the thickness of the semiconductor chip 23 is not particularly limited in the present invention. Incidentally, it is possible not to form the first insulating film 31 on the upper surface of the semiconductor chip 23 and to form the first insulating film 31 on only the surface positioned between the adjacent semiconductor chips. In this case, the adhesive layer 22 alone permits each of the semiconductor chips 23 to be bonded to the base plate 21, with the result that it is possible for the bonding strength between each of the semiconductor chips 23 and the base plate 21 to be rendered insufficient.

In the next step, a metal layer forming a plurality of first underlying metal layers 33, said metal layer being hereinafter referred to as "first underlying metal layer 33 for the sake of convenience, is formed on the upper surface of the connection pad 25 exposed to the outside through the open portions 27 and 32. It is possible for the first underlying metal layer 33 to be of a single layer structure formed of a is copper layer alone formed by a sputtering method, or to be of a laminate structure including a thin film layer of, for example, titanium formed by a sputtering method and a copper layer formed by a sputtering method on the thin film layer of, for example, titanium. This is also the case with a second underlying metal layer 37 referred to herein later.

In the next step, a plating resist film 51 is formed on the upper surface of the first underlying metal layer 33, followed by patterning the resist film 51. The plating resist film 51 is patterned such that an open portion 52 is formed in that portion of the plating resist film 51 which corresponds to the region for forming a first re-wiring 34. After the patterning step, the first re-wiring 34 is formed on the upper surface of the first underlying metal layer 33 within the open portion 52 of the plating resist film 51 by means of an electroplating of copper with the first underlying metal layer 33 used as a plating current passageway.

Figure 5:
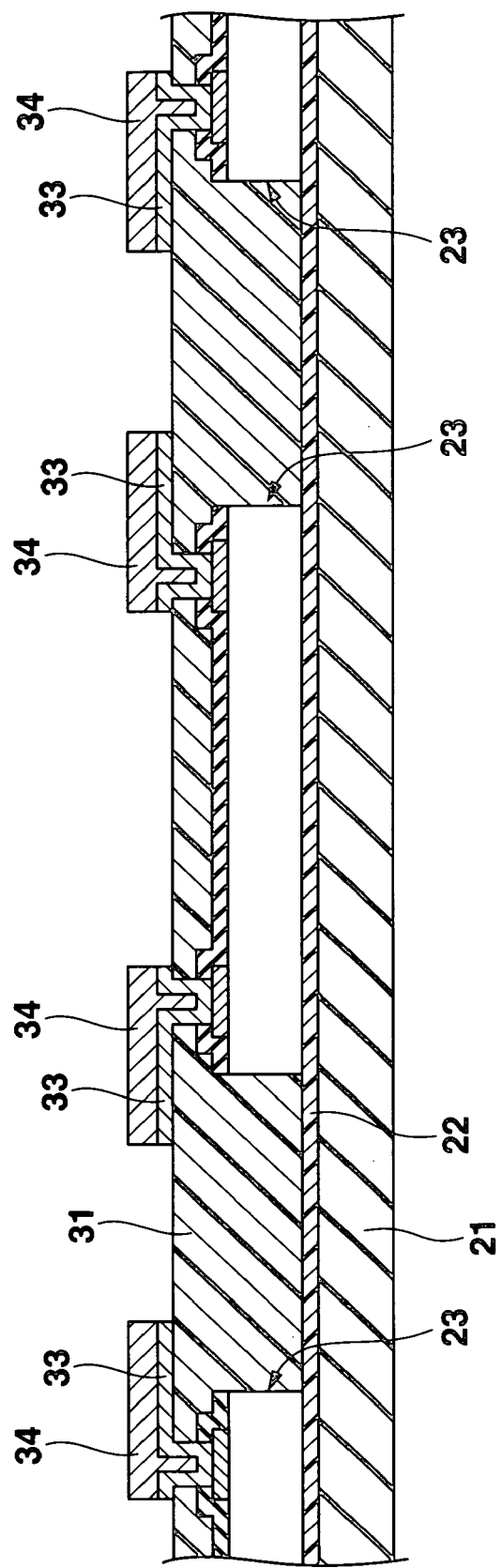
FIG. 5 is a cross sectional view showing in a magnified fashion the gist portion of the manufacturing step following the manufacturing step shown in FIG. 4.

After formation of the first re-wiring 34, the plating resist film 51 is peeled off, followed by removing the undesired portion of the first underlying metal layer 33 by means of etching with the first re-wiring 34 used as a mask thereby. As a result, the first underlying metal layer 33 is left unremoved only below the first re-wiring 34, as shown in FIG. 5.

Figure 6:
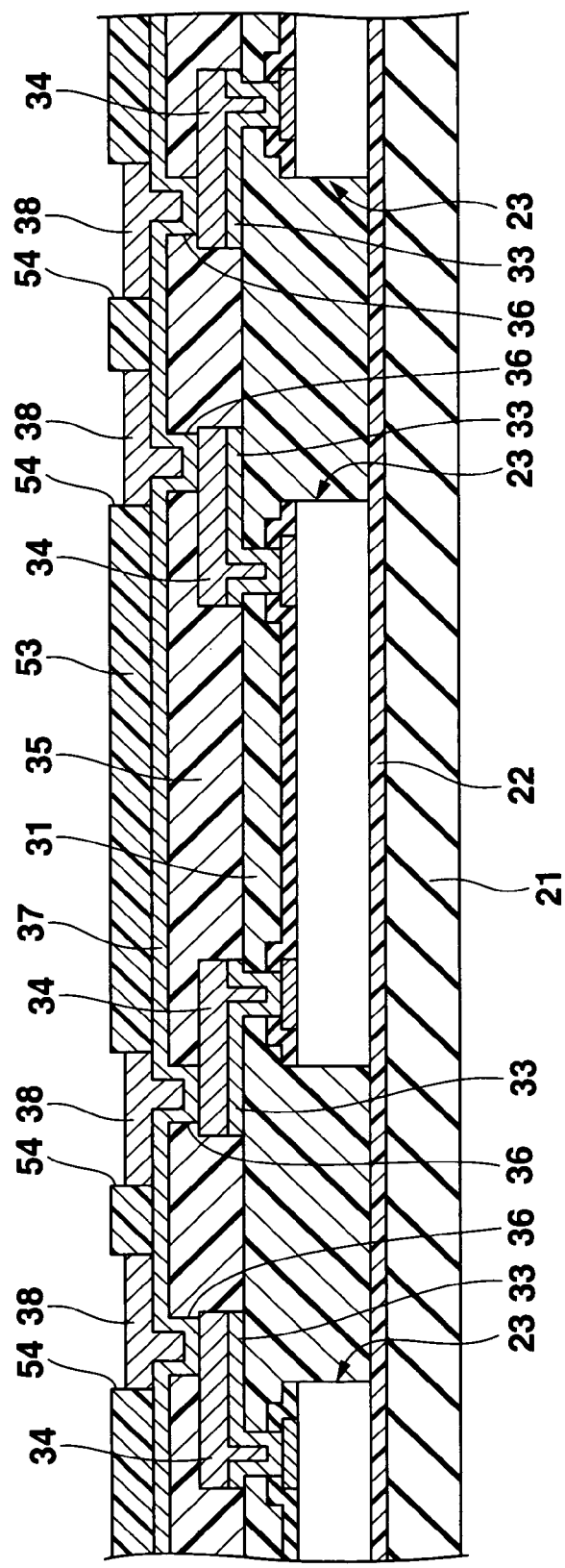
FIG. 6 is a cross sectional view showing in a magnified fashion the gist portion of the manufacturing step following the manufacturing step shown in FIG. 5.

In the next step, a second insulating film 35 made of an organic material such as polyimide or an epoxy-based resin is formed on the entire surface of the first insulating film 31 including the first re-wiring 34, as shown in FIG. 6. It is also possible to employ a spin coating method or a screen printing method for forming the second insulating film 35. The upper surface of the second insulating film 35 is flat, and an open portion 36 is in that portion of the second insulating film 35 which corresponds to the pad portion of the first re-wiring 34. Then, a metal layer forming a second underlying metal layer 37, said metal layer being hereinafter referred to as "a second underlying metal layer 37", is formed on the entire surface of the second insulating film 35 including the pad portion of the first re-wiring 34 exposed to the outside through the open portion 36.

In the next step, a plating resist film 53 is formed on the upper surface of the second underlying metal layer 37, followed by patterning the plating resist film 53. In this case, an open portion 54 is formed in that portion of the plating resist film 53 which corresponds to the region for forming a second re-wiring 38. Then, the second re-wiring 38 is formed on the upper surface of the second underlying metal layer 37 within the open portion 54 of the plating resist film 53 by means of an electrolytic plating of copper with the second underlying metal layer 37 used as a plating current passageway therethrough.

Figure 7:
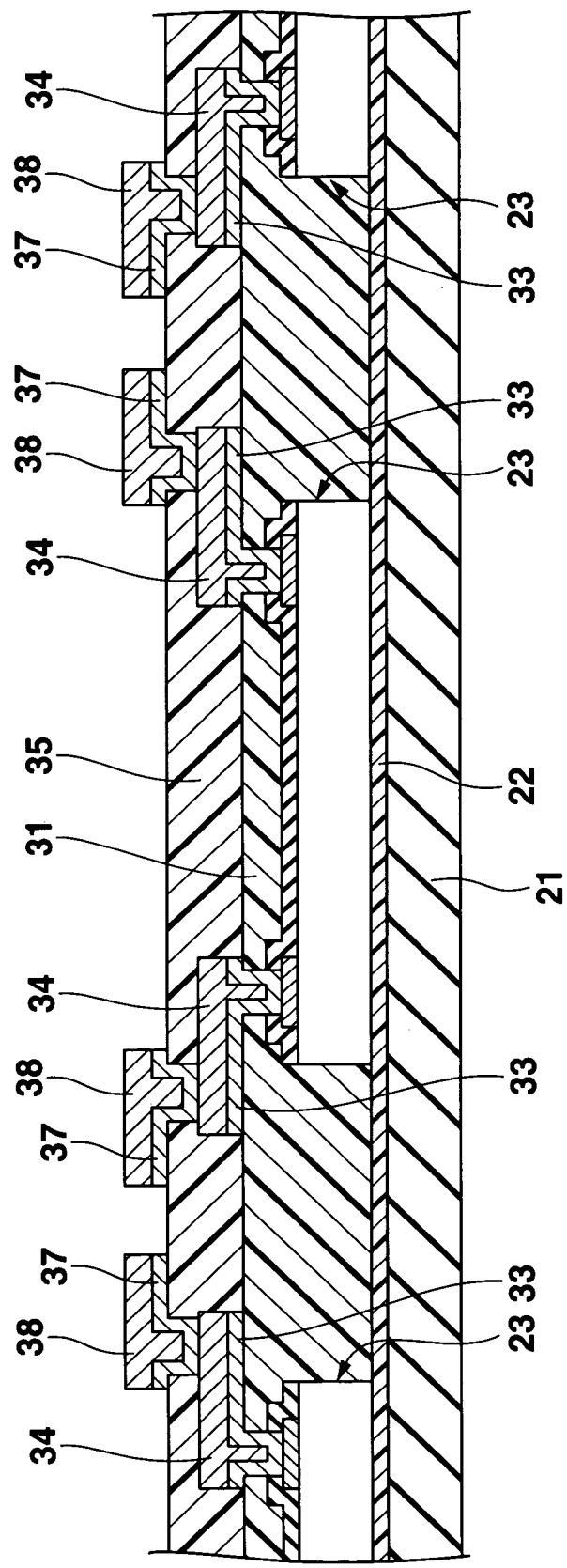
FIG. 7 is a cross sectional view showing in a magnified fashion the gist portion of the manufacturing step following the manufacturing step shown in FIG. 6.

After formation of the second re-wiring 38, the plating resist film 53 is peeled off, followed by removing the undesired portion of the second underlying metal layer 37 by means of etching with the second re-wiring used as a mask thereby. As a result, the second underlying metal layer 37 is left unremoved only below the second re-wiring 38, as shown in FIG. 7.

Figure 8:
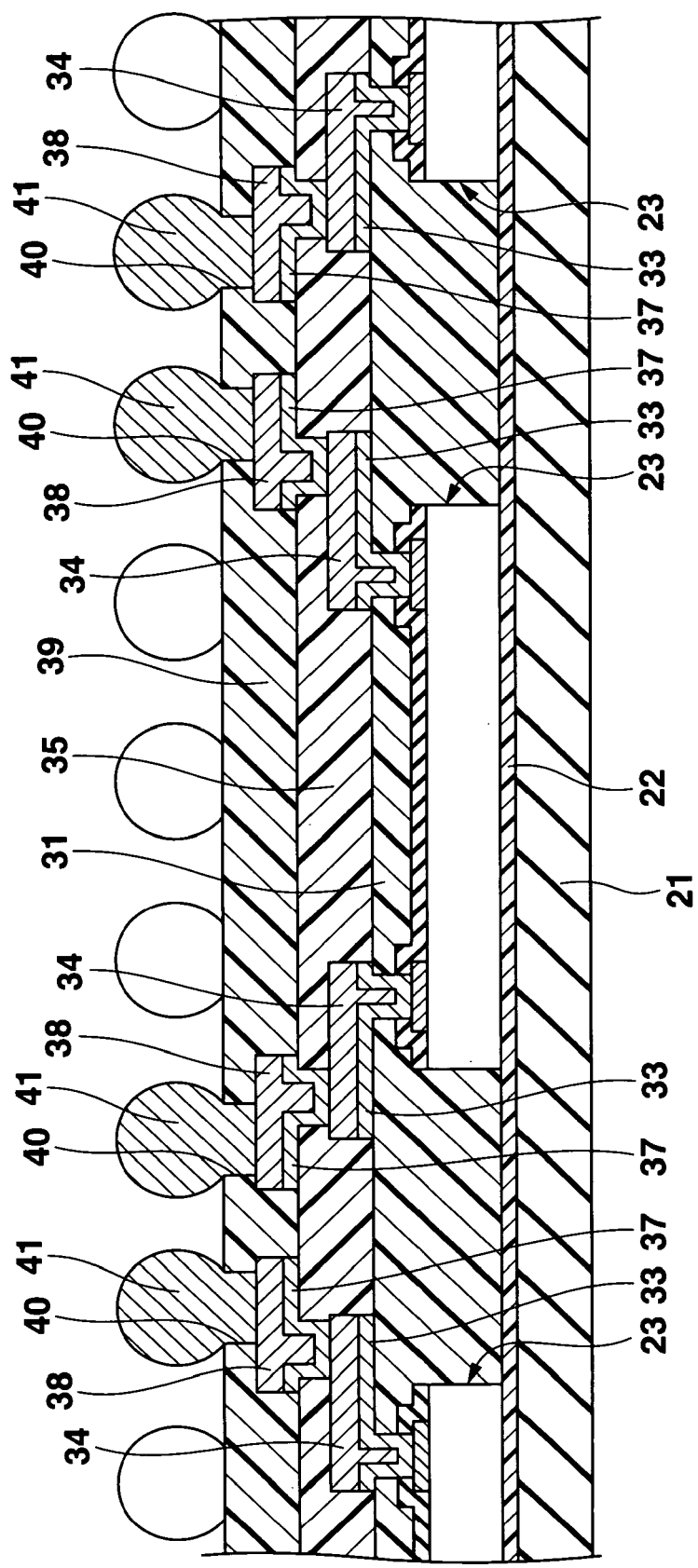
FIG. 8 is a cross sectional view showing in a magnified fashion the gist portion of the manufacturing step following the manufacturing step shown in FIG. 7.

In the next step, a third insulating film 39 made of an organic material such as polyimide or an epoxy-based resin is formed on the entire upper surface of the second insulating film 35 including the second re-wiring 38 by a spin coating method or a screen printing method, as shown in FIG. 8. In this case, the upper surface of the third insulating film 39 is flat, and an open portion 40 is formed in that portion of the third insulating film 39 which corresponds to the pad portion of the second re-wiring. Then, a solder ball 41 is formed within and above the open portion 40 so as to be connected to the pad portion of the second re-wiring 38.

After formation of the solder ball 41, a laminate structure consisting of three insulating films 39, 35, 31, the adhesive layer 22 and the base plate 21 is cut in a region between the adjacent semiconductor chips 23 so as to obtain a plurality of semiconductor devices as shown in FIGS. 1 and 2.

In the semiconductor device thus manufactured, the first underlying metal layer 33 connected to the connection pad 25 of the semiconductor chip 21 and the first re-wiring 34 are formed by the sputtering method and the electroplating method. Likewise, the second underlying metal layer 37 connected to the pad portion of the first re-wiring 34 and the second re-wiring 38 are formed by the sputtering method and the electroplating method. It follows that it is possible to ensure the electrical connection between the connection pad 25 of the semiconductor chip 21 an the first re-wiring 34 and the electrical connection between the first re-wiring 34 and the second re-wiring 38.

It should also be noted that, in the manufacturing method according to the first embodiment of the present invention, a plurality of semiconductor chips 23 are arranged on a prescribed plural portions on the adhesive layer 22 formed on the base plate 21, and the first to third insulating films 31, 35, 39, the first and second underlying metal layers 33, 37, the first and second re-wirings 34, 38 and the solder balls 41 are collectively formed on the plural semiconductor chips 23, followed by cutting the base plate 21 so as to obtain a plurality of semiconductor devices. The particular manufacturing method permits simplifying the manufacturing process. Also, the manufacturing process can be further simplified because a plurality of semiconductor chips 23 are transferred together with the base plate 21. Further, if the outer size of the base plate 21 is made constant, the transfer system can be commonly utilized regardless of the outer size of the semiconductor device to be manufactured.

Another example of the method of manufacturing the semiconductor device shown in FIGS. 1 and 2 will now be described. In the first step, prepared is a base plate structure including another base plate 55 formed of a transparent resin plate transparent to an ultraviolet light or a glass plate, and an adhesive layer 56 formed of an adhesive sheet that can be cured upon irradiation with an ultraviolet light and bonded to the entire upper surface of the base plate 55, said adhesive sheet being not cured in this stage, as well as the base plate 21 and the adhesive layer 22 that are bonded to the upper surface of the adhesive layer 56.

Figure 11:
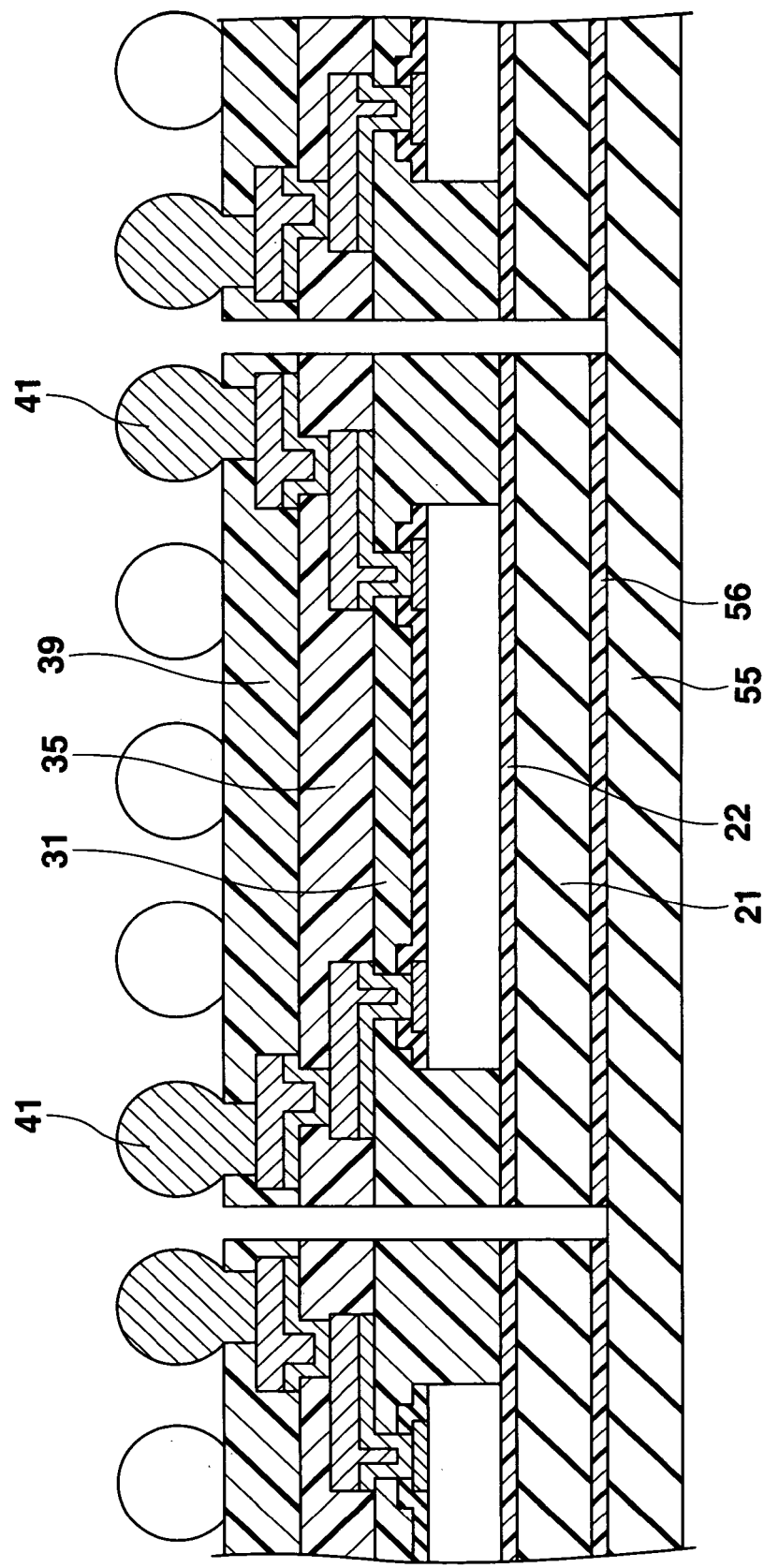
FIG. 11 is a cross sectional view showing in a magnified fashion the gist portion of the manufacturing step following the manufacturing step shown in FIG. 10.

Then, after the manufacturing steps shown in FIGS. 3 to 8 are applied, the laminate structure constructed by the three insulating films 39, 35, 31, the adhesive layer 22, the base plate 21, and the adhesive layer 56 is cut as shown in FIG. 11. It should be noted that the lowermost base plate 55 is not cut in this cutting step. Then, the base plate 55 is irradiated with an ultraviolet light emitted from below the lower surface of the base plate 55 so as to cure the adhesive layer 56. As a result, the adhesivity of the adhesive layer 56 facing the lower surface of the partitioned base plate 21 is lowered. Therefore, the partitioned semiconductor devices present on the adhesive layer 56 are picked up one by one from the lowermost base plate 55 so as to obtain a plurality of semiconductor devices each constructed as shown in FIGS. 1 and 2.

In the manufacturing method described above, the individual semiconductor devices present on the adhesive layer 56 are not separated from each other under the state shown in FIG. 11. Therefore, it is possible to pick up one by one the semiconductor devices when the semiconductor device is mounted on a circuit substrate (not shown) without using a tray used exclusively for disposing thereon the semiconductor device. Also, if the adhesive layer 56 remaining on the upper surface of the lowermost base plate 55 and having the adhesivity lowered is peeled off the lowermost base plate 55, it is possible to utilize again the lowermost base plate 55. Further, if the outer size or dimensions of the lowermost base plate 55 are set constant, the transfer system can be commonly utilized regardless of the outer size of the semiconductor device to be manufactured. Incidentally, it is possible to use a thermosetting adhesive sheet in some cases in place of the adhesive layer 56.

Figure 10:
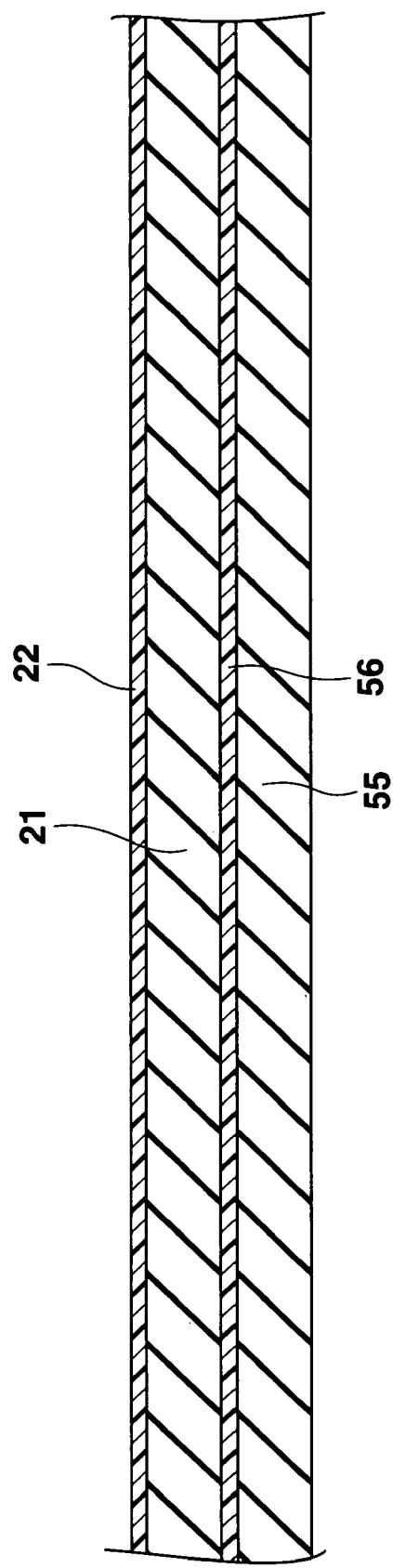
FIG. 10 is a cross sectional view showing in a magnified fashion the gist portion of the initial manufacturing step included in another manufacturing method of the semiconductor device shown in FIGS. 1 and 2.

It is possible for the lowermost base plate 55 shown in FIG. 10 to be shaped like a tray. To be more specific, it is possible for the lowermost base plate 55 to have a side raised wall in the peripheral portion. In this case, a conductive metal layer is formed on the upper surface of the side wall. It should be noted that, the first re-wiring 34 or the second re-wiring 38 may be formed by the electroplating, after the first underlying metal layer 33 or the second underlying metal layer 37 is electrically connected to the conductive metal layer formed on the upper surface of the side wall by an electrical conductor so as to use the conductive metal layer and the electrical conductor as the plating current passageway therethrough. As described above, if the lowermost base plate 55 is shaped like a tray, it is possible to carry out an electroplating under substantially the same conditions by housing the semiconductor device in the tray-shaped lowermost base plate 33 even if the base plates 21 have different sizes.

(Second Embodiment)

Figure 12:
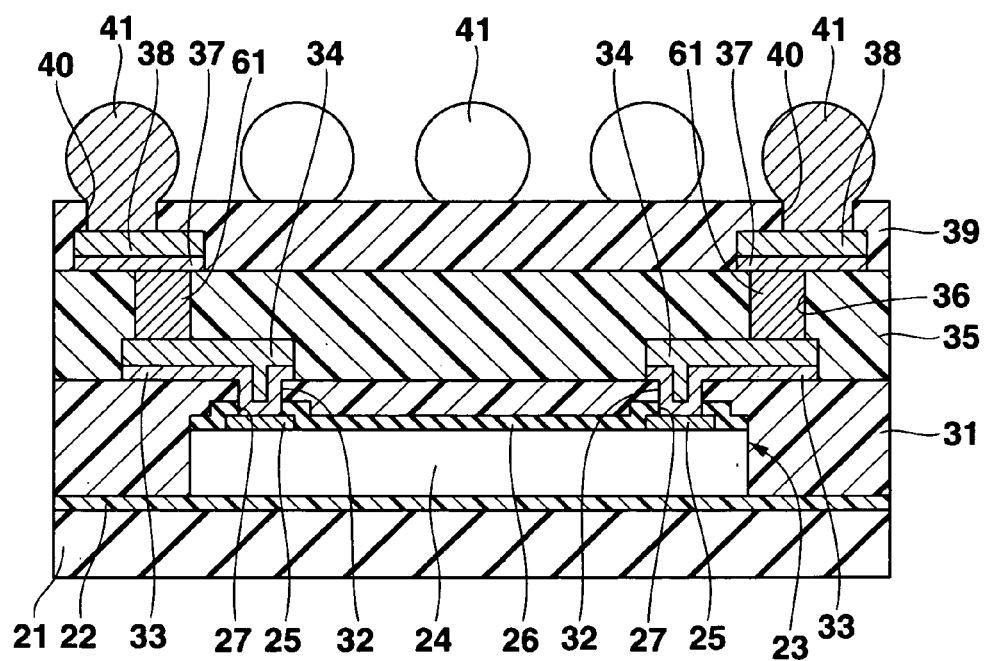
FIG. 12 is a cross sectional view showing in a magnified fashion the gist portion of a semiconductor device according to a second embodiment of the present invention.

FIG. 12 is a vertical cross sectional view showing a semiconductor device according to a second embodiment of the present invention. The semiconductor device shown in FIG. 12 widely differs from the semiconductor device shown in FIG. 2 in that, in the semiconductor device shown in FIG. 12, the pad portion of the first re-wiring 34 is connected to the second underlying metal layer 37 positioned below the second re-wiring 38 via a columnar electrode 61 arranged within the open portion 36 formed in the portion of the second insulating film 35 above the pad portion.

An example of the method of manufacturing the semiconductor device shown in FIG. 12 will now be described. In this case, the manufacturing steps up to the step of peeling off the plating resist film 51 shown in FIG. 4 are equal to those for the first embodiment of the present invention described previously. Therefore, the subsequent manufacturing steps will now be described in conjunction with the second embodiment of the present invention.

Figure 13:
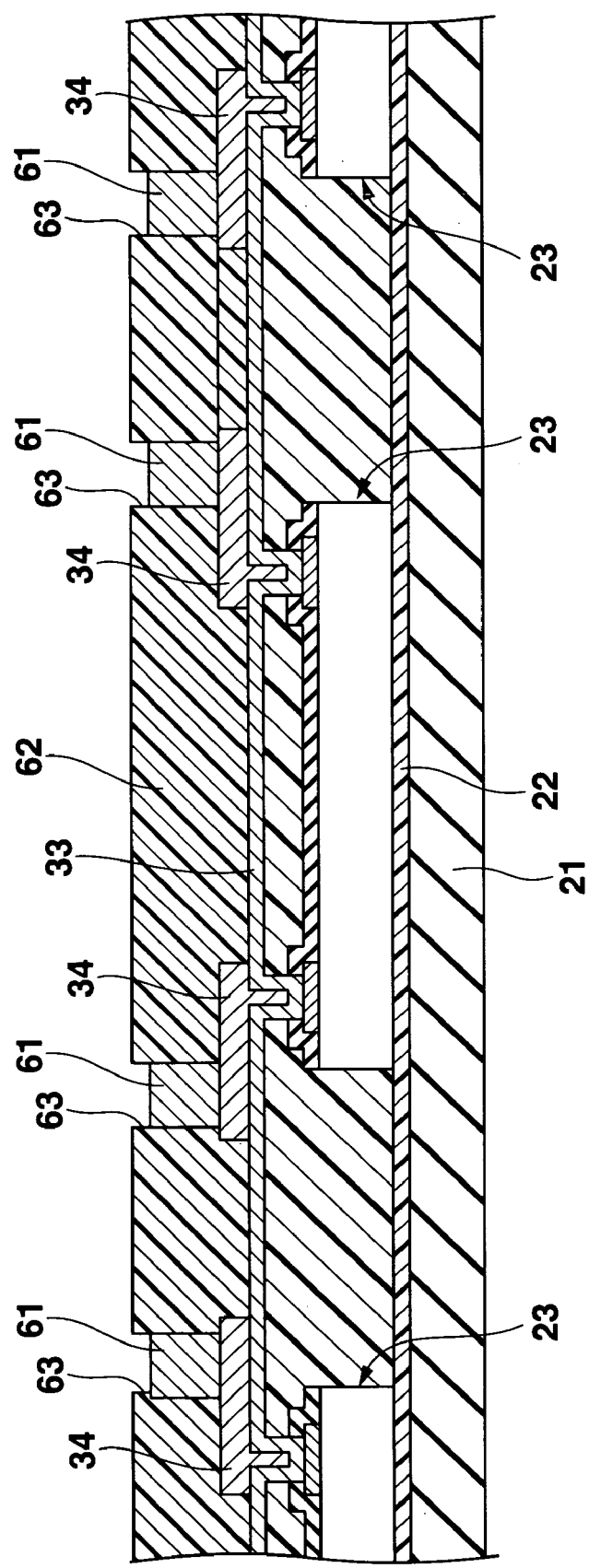
FIG. 13 is a cross sectional view showing in a magnified fashion the gist portion of the semiconductor device shown in FIG. 12.

After the plating resist film 51 is peeled off under the state shown in FIG. 4, a plating resist film 62 is formed on the upper surface of the first underlying metal layer 33 including the first re-wiring 34, followed by patterning the plating resist film 62, as shown in FIG. 13. In this case, an open portion 63 is formed in that portion of the plating resist film 62 which corresponds to the pad portion of the first re-wiring 34.

Figure 14:
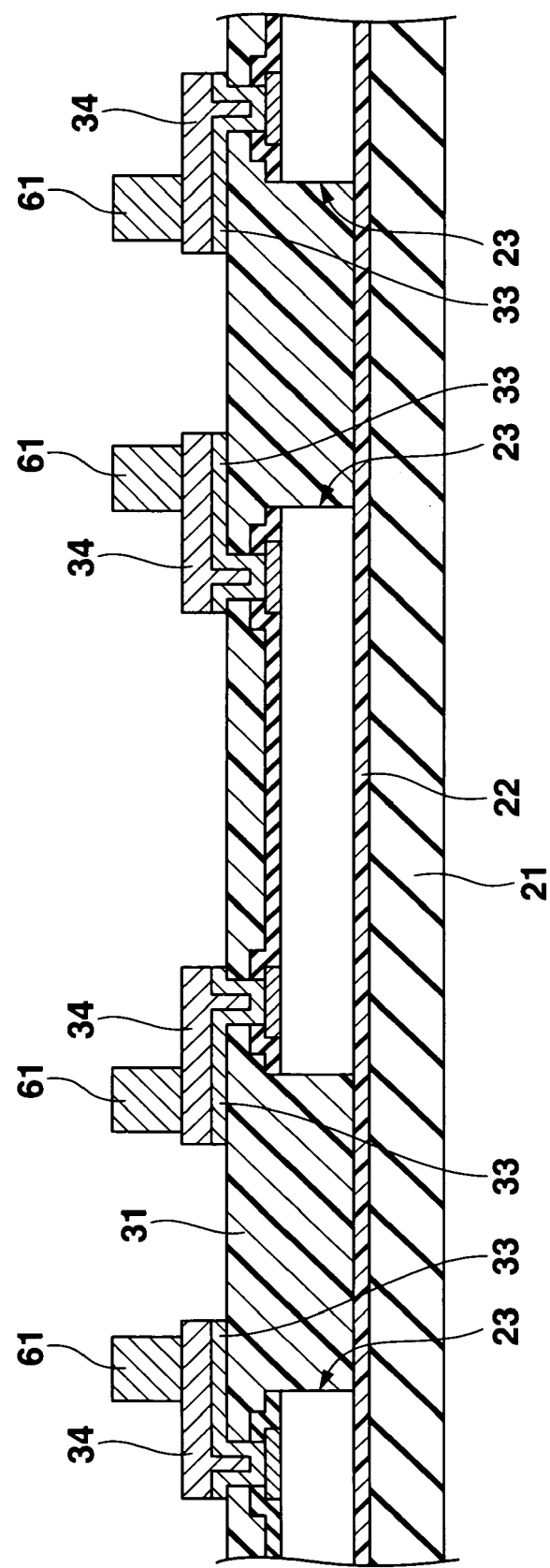
FIG. 14 is a cross sectional view showing in a magnified fashion the gist portion of the manufacturing step following the manufacturing step shown in FIG. 13.
Figure 15:
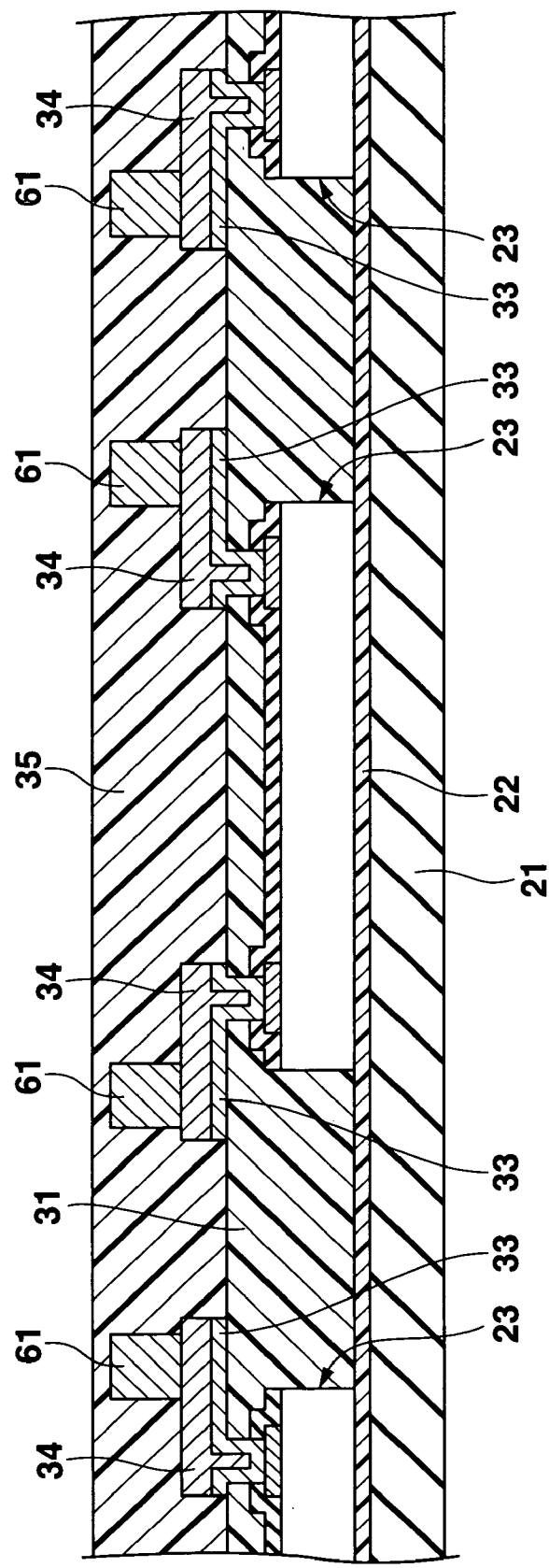
FIG. 15 is a cross sectional view showing in a magnified fashion the gist portion of the manufacturing step following the manufacturing step shown in FIG. 14.

In the next step, the columnar electrode 61 is formed in a height of about 50 to 150 μm on the upper surface of the first re-wiring 34 within the open portion 63 of the plating resist film 62 by means of an electroplating of copper with the first underlying metal layer 33 used as a plating current passageway. Then, the plating resist film 62 is peeled off, followed by removing the undesired portion of the first underlying metal layer 33 by means of etching with the first re-wiring 34 used as a mask. As a result, the first underlying metal layer 33 is left unremoved only below the first re-wiring 34, as shown in FIG. 14.

Figure 16:
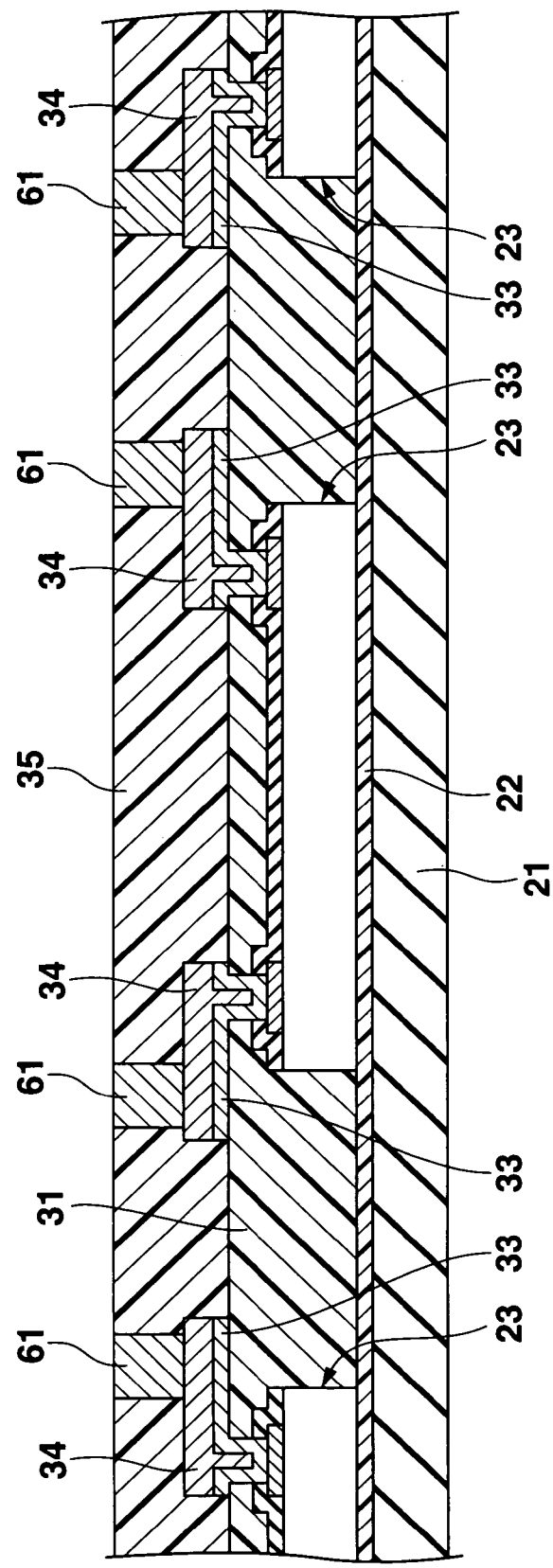
FIG. 16 is a cross sectional view showing in a magnified fashion the gist portion of the manufacturing step following the manufacturing step shown in FIG. 15.

In the next step, a second insulating film 35 made of an organic material such as polyimide or an epoxy-based resin is formed on the entire surface of the first insulating film 31 including the columnar electrode 61 and the first re-wiring 34. The second insulating film 35 is formed somewhat thicker than the height of the columnar electrode 61. It follows that, under the state noted above, the upper surface of the columnar electrode 61 is covered with the second insulating film 35. Then, the upper surface of the second insulating film 35 is polished appropriately so as to expose the upper surface of the columnar electrode 61 to the outside, as shown in FIG. 16.

Figure 17:
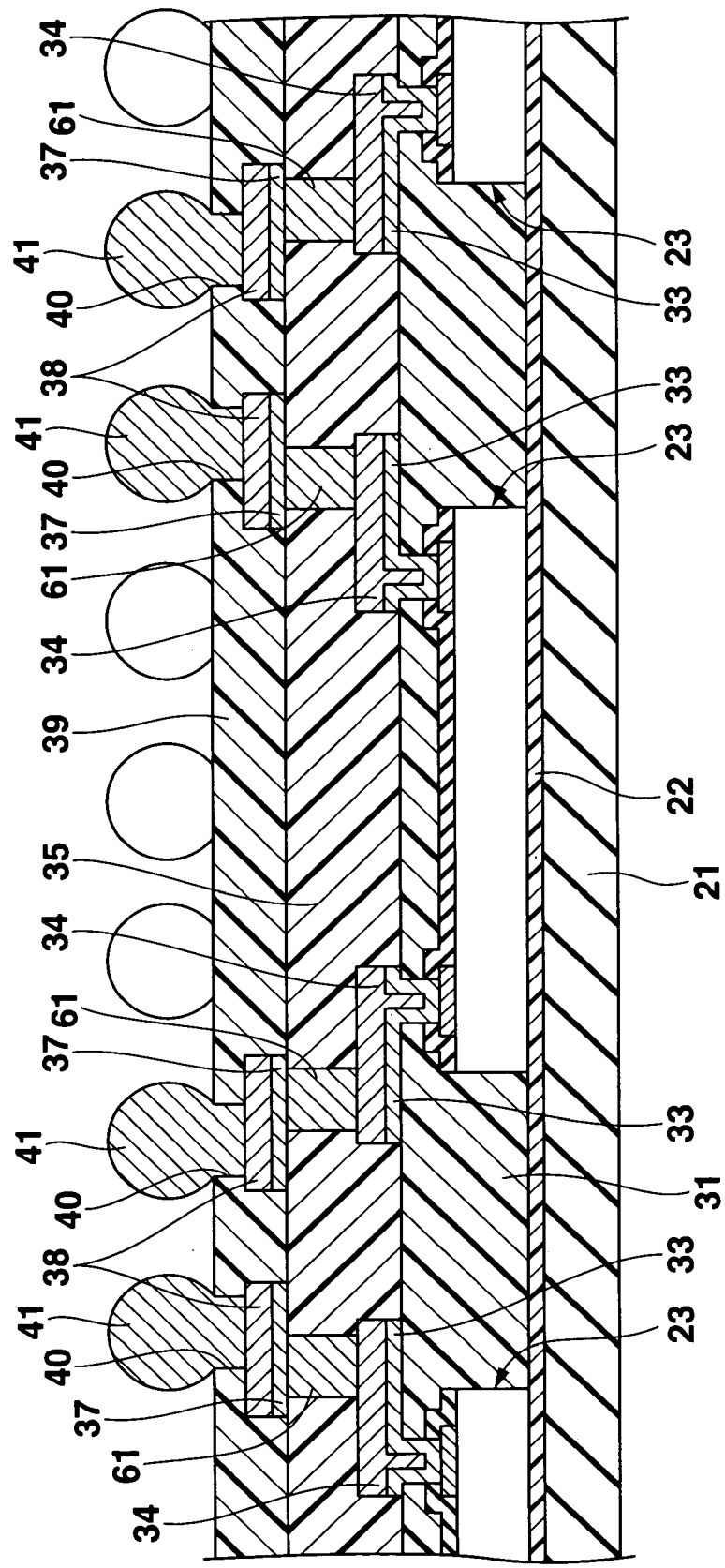
FIG. 17 is a cross sectional view showing in a magnified fashion the gist portion of the manufacturing step following the manufacturing step shown in FIG. 16.
Figure 18:
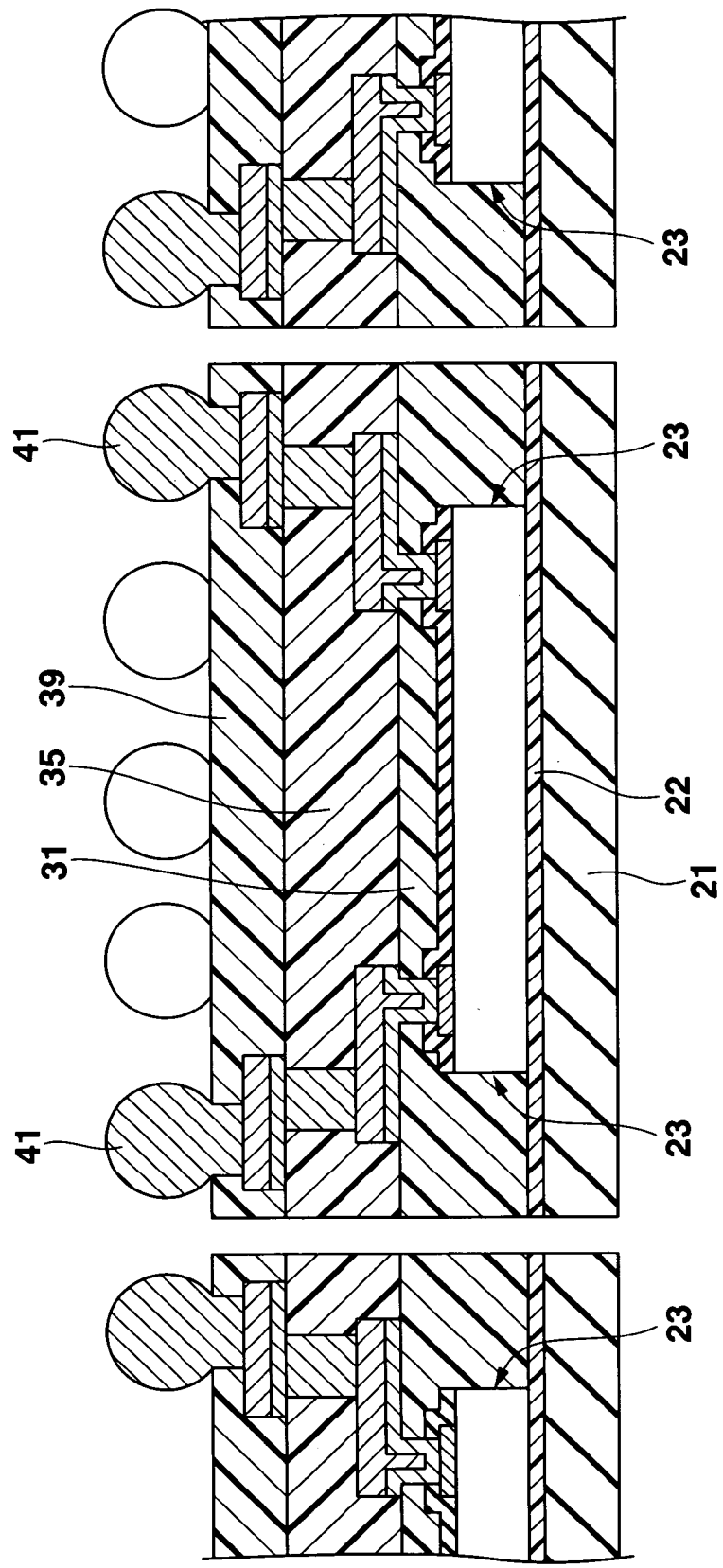
FIG. 18 is a cross sectional view showing in a magnified fashion the gist portion of the manufacturing step following the manufacturing step shown in FIG. 17.

Then, the manufacturing steps substantially equal to those shown in FIGS. 7 and 8 are applied so as to form the second underlying metal layer 37 and the second re-wiring 38 on the upper surface of the second insulating film 35 including the upper surface of the columnar electrode 61, followed by forming the third insulating film 39 on the upper surface of the second insulating film 35 including the second re-wiring 38 and subsequently patterning the third insulating film 39 and, then, forming the solder ball 41 within and above the open portion 40 of the third insulating film 39 so as to be connected to the pad portion of the second re-wiring 38, as shown in FIG. 17.

Finally, a laminate structure including the three insulating films 39, 35, 31, the adhesive layer 22, and the base plate 21 is cut in a region between adjacent semiconductor chips 23 so as to obtain a plurality of semiconductor devices each constructed as shown in FIG. 12.

In the semiconductor device thus manufactured, each of the first underlying metal layer 33 connected to the connection pad of the semiconductor chip 21 and the first re-wiring 34 is formed by the sputtering method and the electroplating method. The columnar electrode 61 is also formed by the electroplating method on the pad portion of the first re-wiring 34. Further, each of the second underlying metal layer 37 connected to the upper surface of the columnar electrode 61 and the second re-wiring 38 is formed by the sputtering method and the electroplating method. It follows that it is possible to ensure the conductive connection between the connection pad 25 of the semiconductor chip 21 and the first re-wiring, the conductive connection between the first re-wiring 34 and the columnar electrode 61, and the conductive connection between the columnar electrode 61 and the second re-wiring 38.

It should also be noted that the semiconductor device according to the second embodiment of the present invention comprises the columnar electrode 61 having a relatively large height of about 50 to 150 μm. This makes it possible to ensure a relatively large space between the first re-wiring 34 and the second re-wiring 38 so as to suppress the electrical interference between the re-wirings 34 and 38. What should also be noted is that, after the semiconductor device is mounted on a circuit substrate (not shown) with the solder balls 41 interposed therebetween, the columnar electrodes 61 permit somewhat moderating the internal stress derived from the difference of the thermal expansion coefficient between the silicon substrate 24 and the circuit substrate.

Also, when it comes to the manufacturing method of the semiconductor device according to the second embodiment of the present invention, the adhesive layer 22 is not formed on the entire surface of the base plate 21, and each of the semiconductor chips 23 is bonded to the adhesive layer 22 formed selectively on the portion where the semiconductor chip 23 is to be mounted. Also, the first to third insulating films 31, 35, 39, the first and second underlying metal layers 33, 37, the first and second re-wirings 34, 38, the columnar electrodes 61 and the solder balls 41 are collectively formed for a plurality of semiconductor chips 23, followed by separating the base plate 21 appropriately so as to obtain collectively a plurality of semiconductor devices. Naturally, the particular manufacturing method according to the second embodiment of the present invention permits simplifying the manufacturing process of the semiconductor device. It should also be noted that, since the plural semiconductor chips 23 can be transferred together with the base plate 21, the manufacturing process of the semiconductor device can be further simplified. Further, if the outer size of the base plate 21 is made constant, the transfer system can be commonly utilized regardless of the outer size of the semiconductor device to be manufactured.

It is possible to modify the manufacturing method according to the second embodiment of the present invention such that prepared is a substrate structure including the lowermost base plate 55 shown in FIG. 10 and an adhesive layer 56 formed on the upper surface of the lowermost base plate 55. In this case, after formation of the solder ball 41, a laminate structure including the three insulating films 39, 35, 31, the adhesive layer 22, the base plate 21 and the adhesive layer 56 is cut so as to separate the resultant semiconductor devices from each other, and the individual semiconductor devices present on the adhesive layer 56 is picked up one by one.

Figure 19:
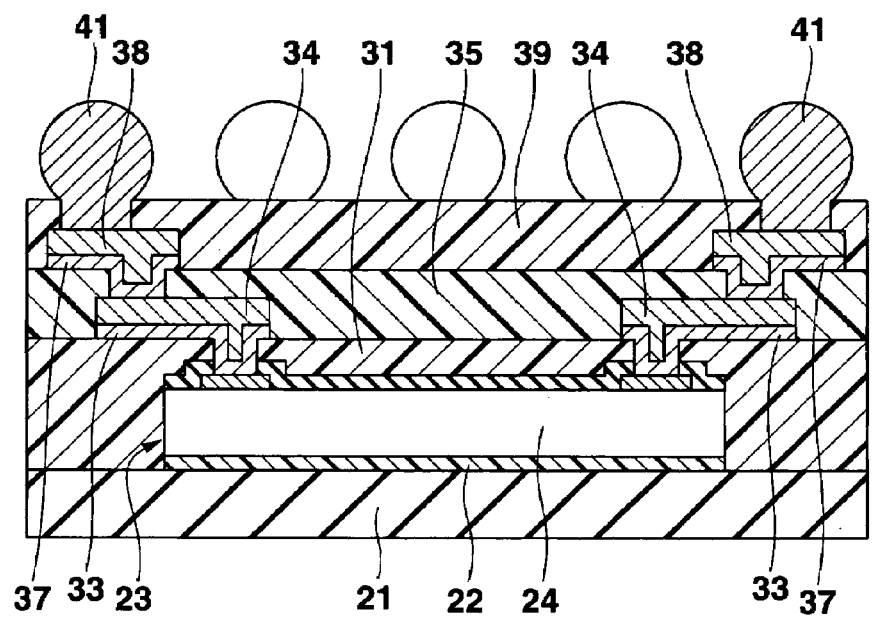
FIG. 19 is a cross sectional view showing in a magnified fashion the gist portion of a semiconductor device according to a third embodiment of the present invention.

(Third Embodiment)

Where the adhesive layer 22 is formed on only the lower surface of the silicon substrate 24 of the semiconductor chip 23 and the adhesive layer 22 is bonded to a prescribed position on the upper surface of the base plate 21 in the manufacturing step shown in FIG. 3, it is possible to obtain a semiconductor device according to a third embodiment of the present invention, which is shown in FIG. 19. For forming the adhesive layer 22 on the lower surface of the silicon substrate 24 of the semiconductor chip 23, it is efficient to fix the adhesive layer 22 to the back surface of the silicon wafer having connection pads 25 and an insulating film 26 formed thereon, followed by dicing the silicon wafer so as to obtain the semiconductor chip 23 having the adhesive layer 22 formed on the back surface. Alternatively, it is possible to drip a die coating material by using, for example, a dispenser onto those regions of the base plate 21 on which the semiconductor chips 23 are to be mounted, followed by mounting the semiconductor chips 23 on the die coating material and subsequently fixing the semiconductor chips 23 to the base plate 21 by the heating under pressure.

(Fourth Embodiment)

Figure 20:
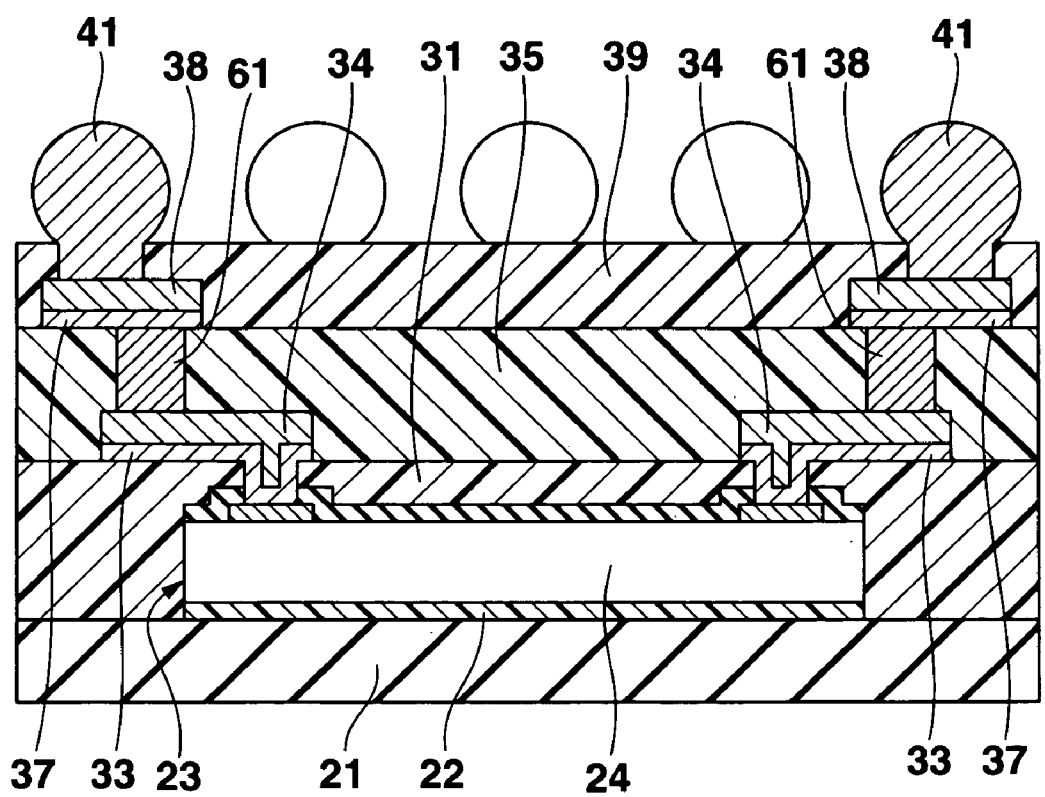
FIG. 20 is a cross sectional view showing in a magnified fashion the gist portion of a semiconductor device according to a fourth embodiment of the present invention.

Where, in the second embodiment shown in FIG. 12, the adhesive layer 22 is formed on the lower surfaces alone of the silicon substrates 24 of the semiconductor chips 23 and the adhesive layers 22 are bonded to prescribed positions on the upper surface of the base plate 21 as in the third embodiment of the present invention described above, it is possible to obtain a semiconductor devices according to a fourth embodiment of the present invention, which is shown in FIG. 20.

In the semiconductor device according to each of the third and fourth embodiments of the present invention, the lower surface of the silicon substrate 24 of the semiconductor chip 23 is bonded to the upper surface of the base plate 21 with the adhesive layer 22 interposed therebetween. In addition, the side surface, etc. of the silicon substrate 24 is bonded to the upper surface of the base plate 21 with the first insulating film 31 interposed therebetween. It follows that it is possible to select the material of the first insulating film 31 in view of only the bonding strength between the first insulating film 31 and the base plate 21, and it is unnecessary to take the adhesivity between the first insulating film 31 and the adhesive layer 22 into account.

(Fifth Embodiment)

Figure 21:
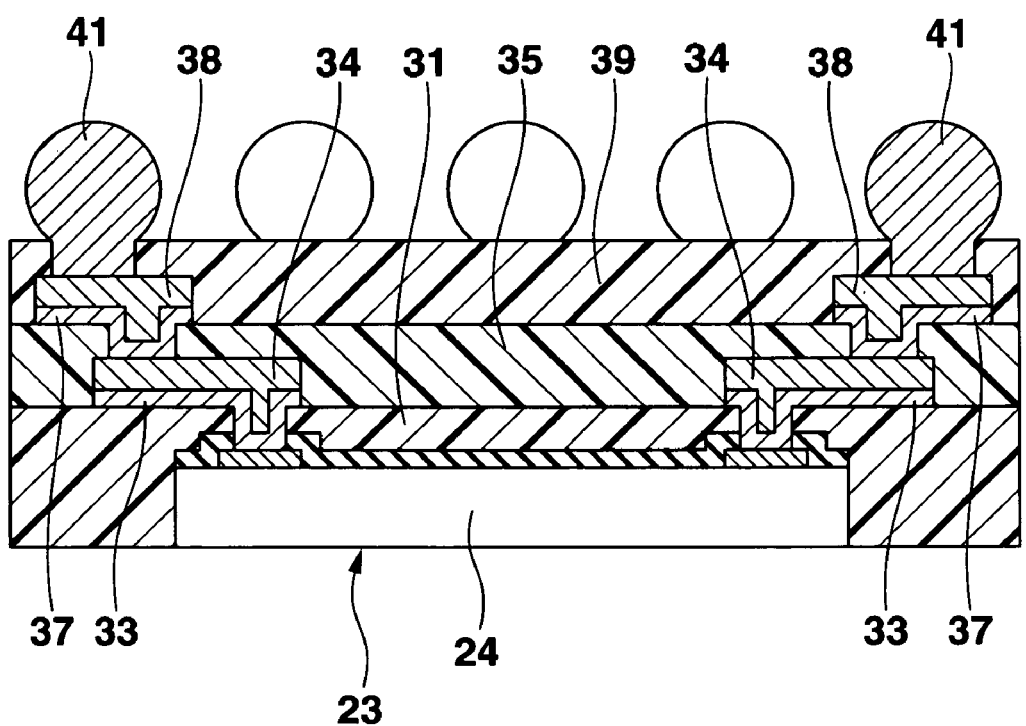
FIG. 21 is a vertical cross sectional view showing a semiconductor device according to a fifth embodiment of the present invention.

FIG. 21 is a vertical cross sectional view showing a semiconductor device according to a fifth embodiment of the present invention. The semiconductor device shown in FIG. 21 differs from the semiconductor device shown in FIG. 2 in that the semiconductor device shown in FIG. 21 does not comprise the base plate 21 and the adhesive layer 22.

Figure 22:
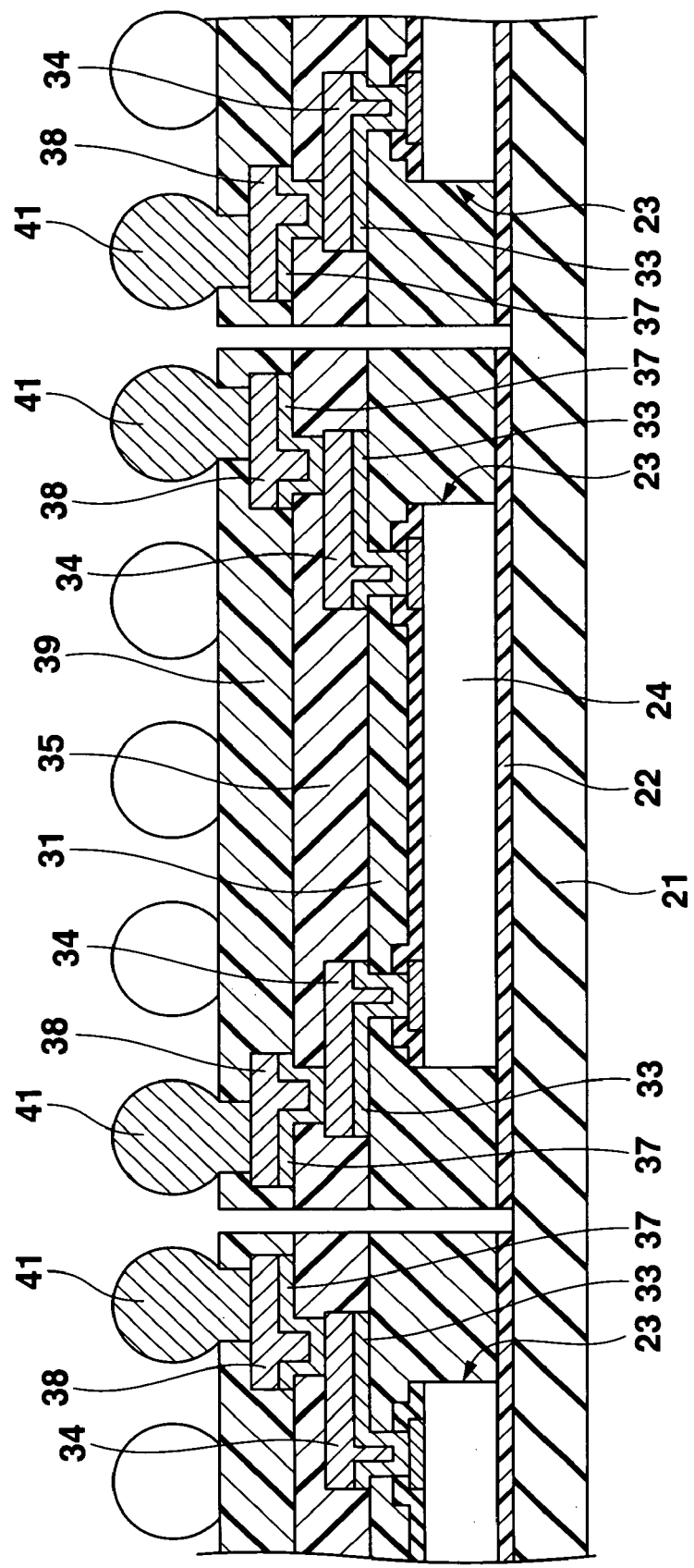
FIG. 22 is a cross sectional view showing in a magnified fashion the gist portion for describing the manufacturing process of the semiconductor device shown in FIG. 21.

In manufacturing the semiconductor device according to the fifth embodiment of the present invention, it is necessary for the base plate 21 to be formed of a transparent resin plate transparent to an ultraviolet light or a glass plate and for the adhesive layer 22 to be formed of an adhesive tape of an ultraviolet light curing type under the state shown in FIG. 8. Also, a laminate structure including the three insulating layers 39, 35, 31 and the adhesive layer 22 is cut in the region between the adjacent semiconductor chips 23 and the base plate 21 is not cut, as shown in FIG. 22.

In the next step, the base plate 21 is irradiated with an ultraviolet light emitted from below the lower surface of the base plate 21 so as to cure the adhesive layer 22. As a result, the adhesivity of the adhesive layer 22 to the silicon substrate 24 of the semiconductor chip 23 and to the lower surface of the first insulating film 31 around the silicon substrate 24 is lowered. It follows that it is possible to obtain a plurality of semiconductor devices each constructed as shown in FIG. 21, if the individual semiconductor devices present on the adhesive layer 22 are picked up one by one.

The semiconductor device thus obtained does not include the base plate 21 and the adhesive layer 22 and, thus, the thickness of the semiconductor device can be decreased. Also, the individual semiconductor devices present on the adhesive layer 22 are not separated from each other. Therefore, it is possible to pick up one by one the semiconductor devices when the semiconductor devices are mounted to a circuit substrate (not shown) without using a tray used exclusively for disposing thereon the semiconductor device. Also, if the adhesive layer 22 remaining on the upper surface of the base plate 21 and having the adhesivity lowered is peeled off the base plate 21, it is possible to utilize again the base plate 21.

(Sixth Embodiment)

Figure 23:
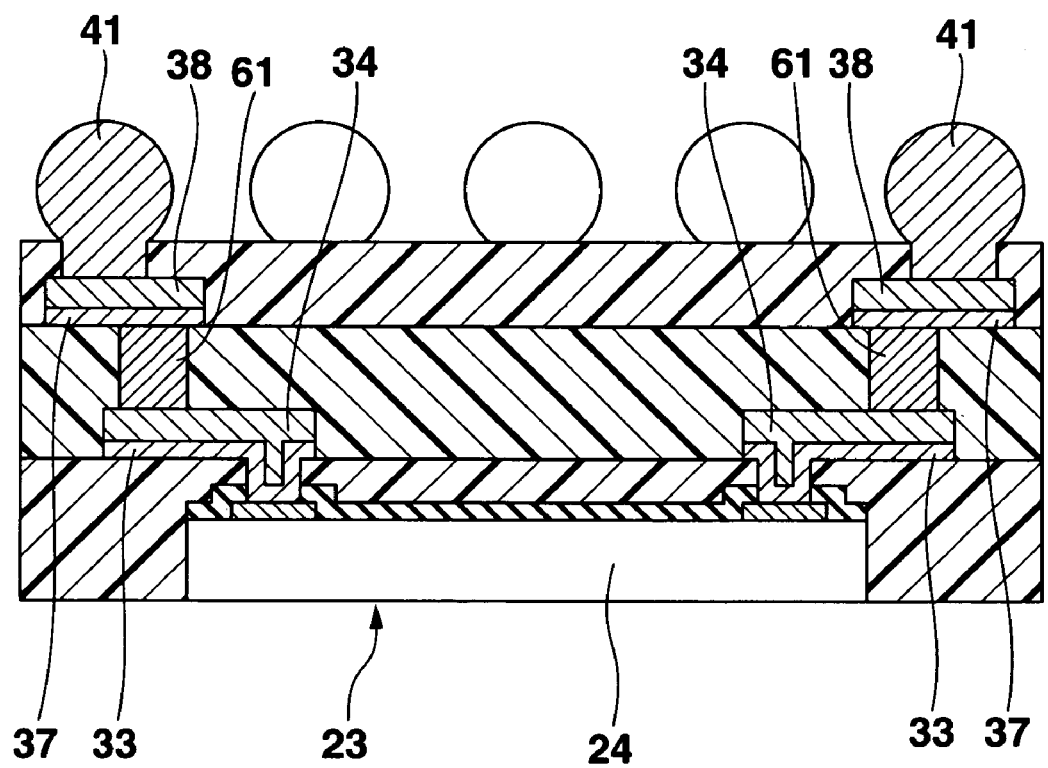
FIG. 23 is a cross sectional view showing in a magnified fashion the gist portion of a semiconductor device according to a sixth embodiment of the present invention.

When it comes to a semiconductor device comprising the columnar electrode 61 as shown in FIG. 12, it is possible to obtain a semiconductor device that does not include the base plate 21 and the adhesive layer 22 as in the sixth embodiment of the present invention shown in FIG. 23.

(Seventh Embodiment)

Figure 9:
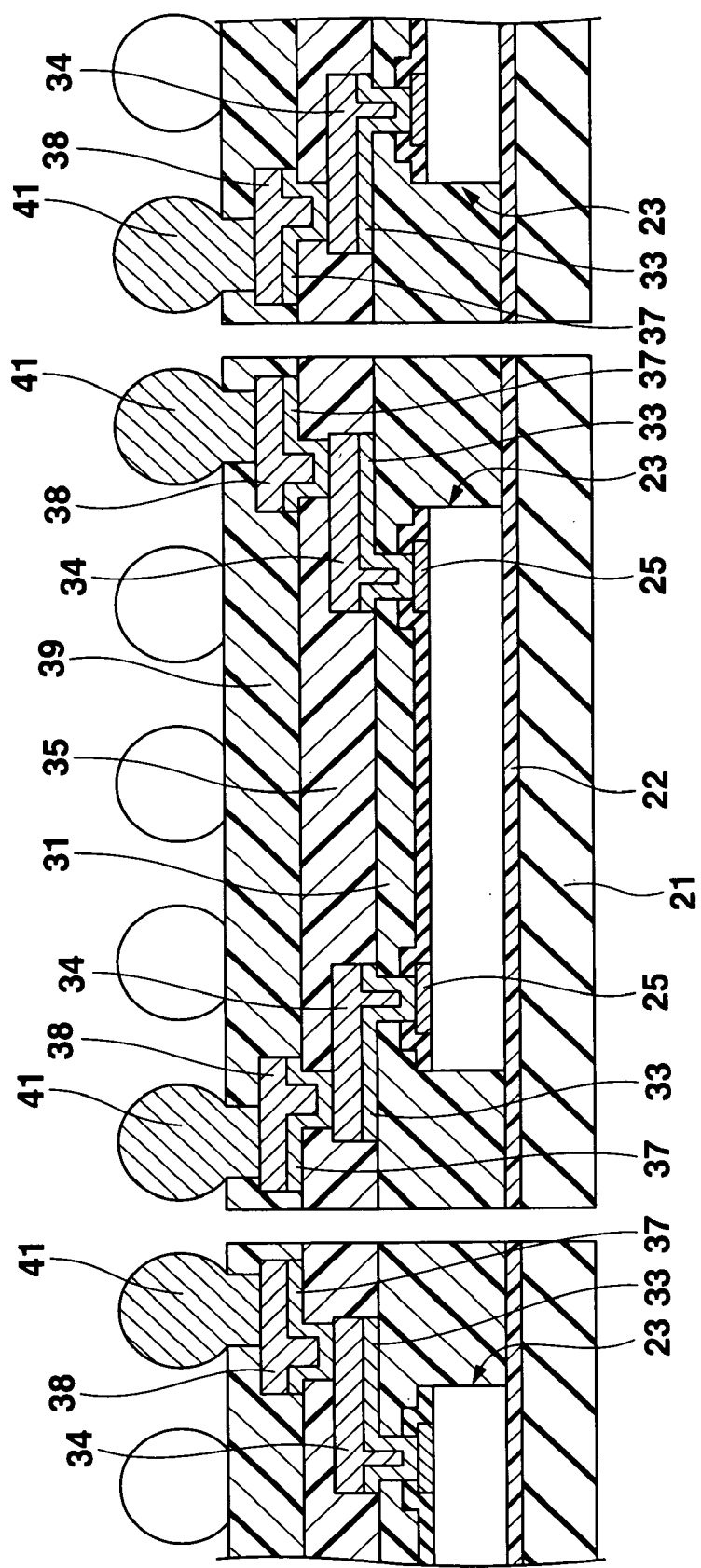
FIG. 9 is a cross sectional view showing in a magnified fashion the gist portion of the manufacturing step following the manufacturing step shown in FIG. 8.

In the embodiment shown in FIG. 9, a laminate structure including the three insulating films, etc. is cut in a region between the two adjacent semiconductor chips 23. However, it is also possible to cut the laminate structure noted above in a manner to obtain a large chip including two more semiconductor chips 23 so as to obtain a multi-chip module type semiconductor device according to a seventh embodiment of the present invention shown in FIG. 24. In the seventh embodiment, the two semiconductor chips 23 shown in the figure are not separated from each other, and the substrate is cut such that the cut piece includes at least two integral semiconductor chips 23. In each of the semiconductor devices, the second underlying metal layer 37 and the second re-wiring layer 38 positioned between the adjacent semiconductor chips 23 are formed to electrically connect the two semiconductor chips 23. In the seventh embodiment shown in FIG. 24, two solder balls 41 are formed on the second re-wiring layer 38. However, it is possible to use a single solder ball 41 in terms of the electrical function. What should be noted is that it is possible to obtain a so-called "multi-chip module", in which each of the semiconductor devices separated from each other by cutting is allowed to include a plurality of semiconductor chips 23. This is also the case with any of the embodiments described above.

(Eighth Embodiment)

Figure 24:
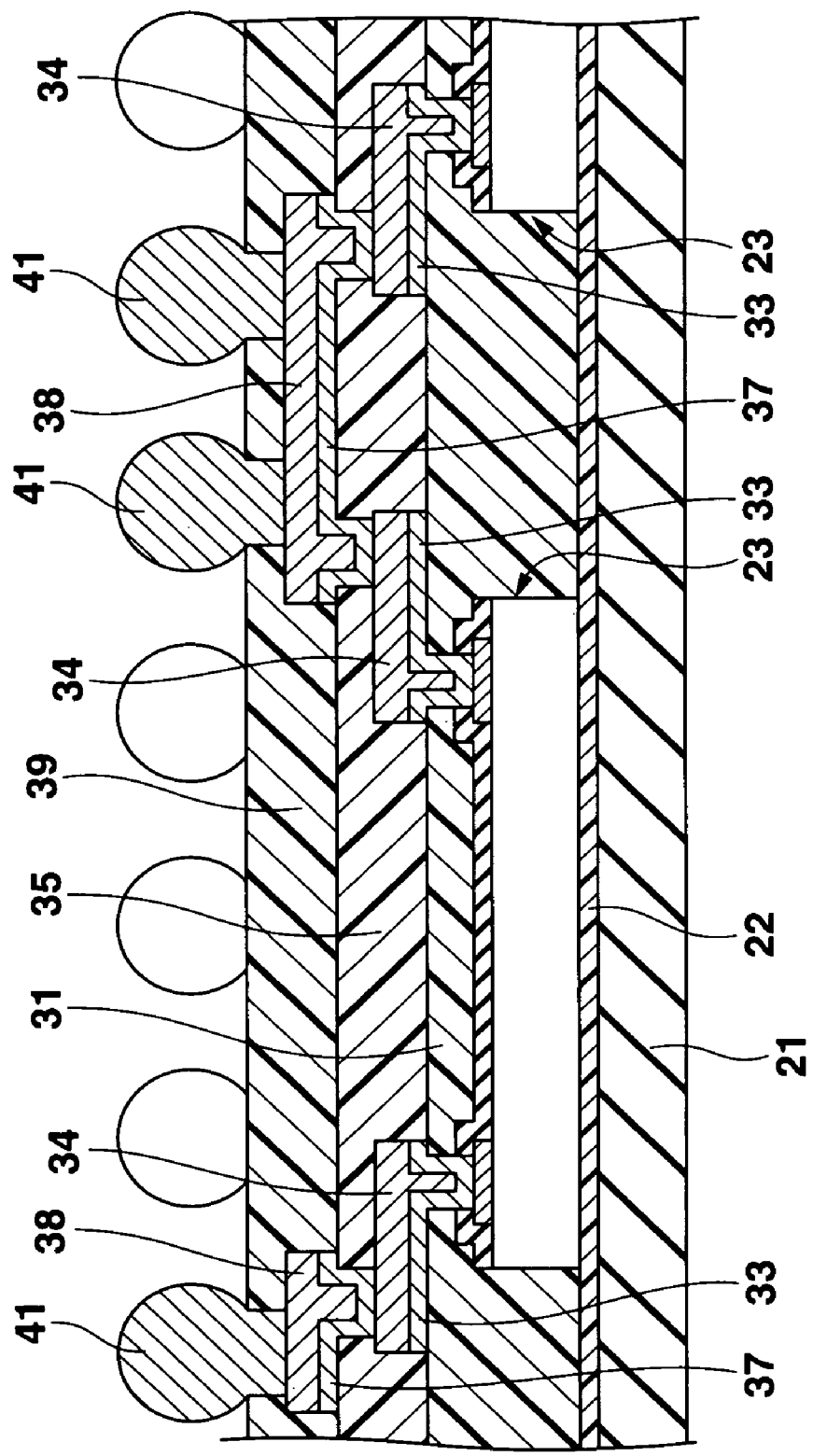
FIG. 24 is a cross sectional view showing in a magnified fashion the gist portion of a semiconductor device according to a seventh embodiment of the present invention.

In the embodiment shown in FIG. 24, the semiconductor devices are separated from each other such that each of the separated semiconductor devices includes two or more semiconductor chips 23 as a set. Alternatively, it is possible for a chip part 71 including, for example, a capacitor, an inductor, and a resistor to be arranged on the base plate 21 in addition to the two or more semiconductor chips 23 in each of the separated semiconductor device, as in an eighth embodiment of the present invention shown in FIG. 25. In this case, one of the first wirings 34a connected to the chip part 71 is directly connected to the first re-wiring 34 connected to one of the semiconductor chips 23, and the other first re-wiring 34a is connected to the first re-wiring 34 via the second re-wiring 38 connected to the other semiconductor chip 23.

Figure 25:
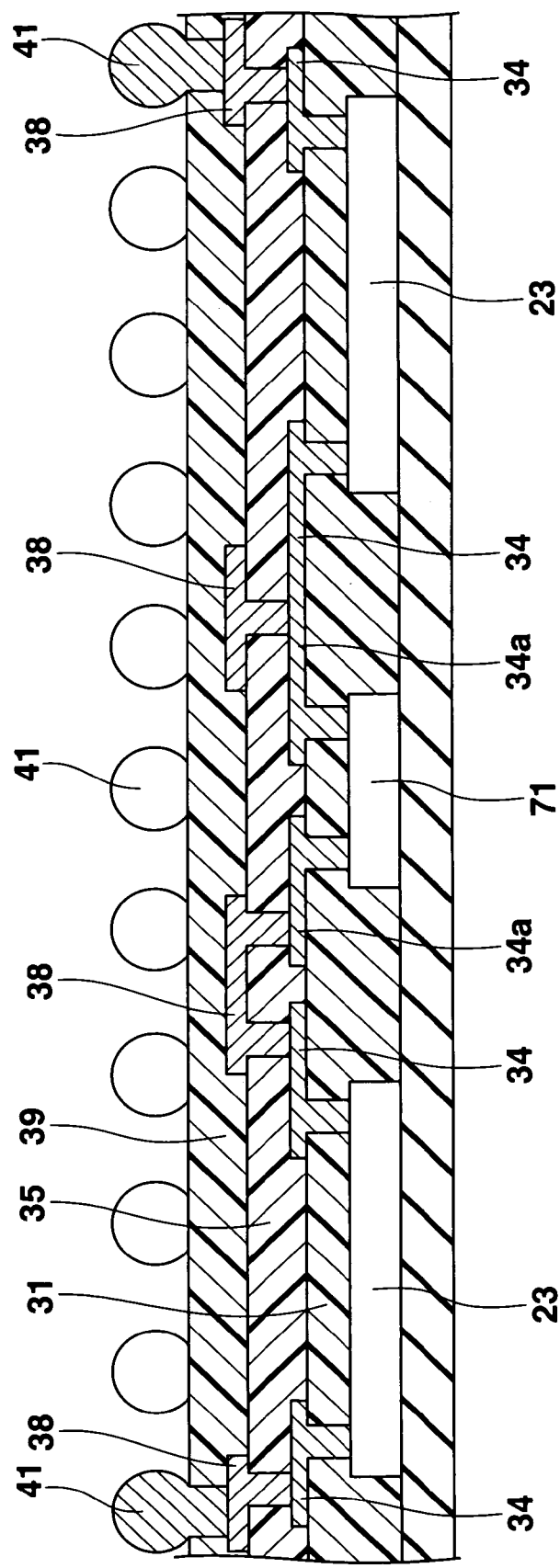
FIG. 25 is a cross sectional view showing in a magnified fashion the gist portion of a semiconductor device according to an eighth embodiment of the present invention.

In each of the seventh embodiment shown in FIG. 24 and the eighth embodiment shown in FIG. 25, it is possible to form collectively the first to third insulating films 31, 35, 39, the first and second re-wirings 34, 38 and the solder balls 41 even if each of the semiconductor chips 23 and the chip parts 71 differs from each other in the shape and the thickness, followed by separating the semiconductor substrate so as to obtain simultaneously a plurality of semiconductor devices. It follows that it is possible to simplify the manufacturing process of the semiconductor device.

(Modifications of Embodiments)

In the semiconductor device of the present invention, the number of re-wiring layers is not limited to two as in each of the embodiments described above. It is possible for the semiconductor device of the present invention to include a single re-wiring layer or three or more re-wiring layers. Where the semiconductor device includes a single re-wiring layer, at least a part of the pad portion of the re-wiring is arranged on the insulating film in the periphery of the silicon substrate. On the other hand, where the semiconductor device includes three or more re-wiring layers, it is advisable to arrange a columnar electrode between the adjacent re-wiring layers. Also, it is advisable to arrange a columnar electrode on the pad portion of the uppermost re-wiring layer regardless of the number of re-wiring layers, to cover the uppermost layer except the upper surface of the columnar electrode with an insulating film, and to form a solder ball on the columnar electrode.

In each of the embodiments described above, the bonding surface of the semiconductor device, i.e., the surface on which the solder balls 41 are formed, is provided by the upper surface of the semiconductor chip. However, it is also possible for the bonding surface of the semiconductor device to be provided by the lower surface of the semiconductor chip or by both the upper surface and the lower surface of the semiconductor chip. Some embodiments of the particular semiconductor device will now be described.

(Ninth Embodiment)

Figure 26:
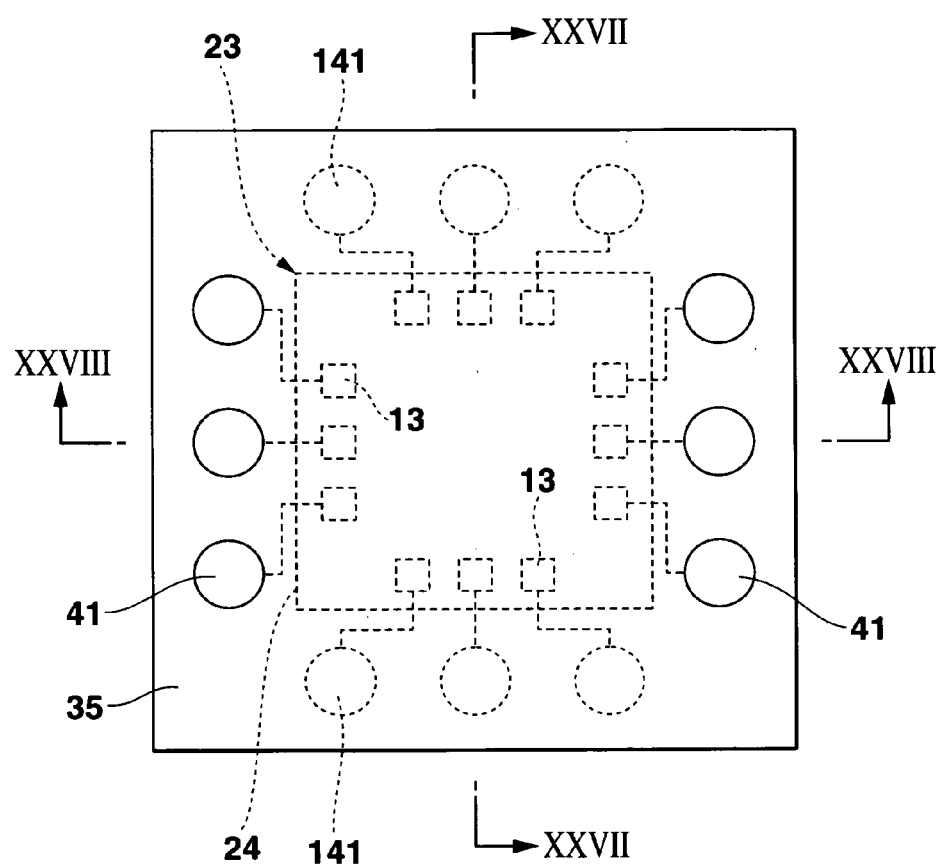
FIG. 26 is a plan view showing in a magnified fashion a semiconductor device according to a ninth embodiment of the present invention.
Figure 27:
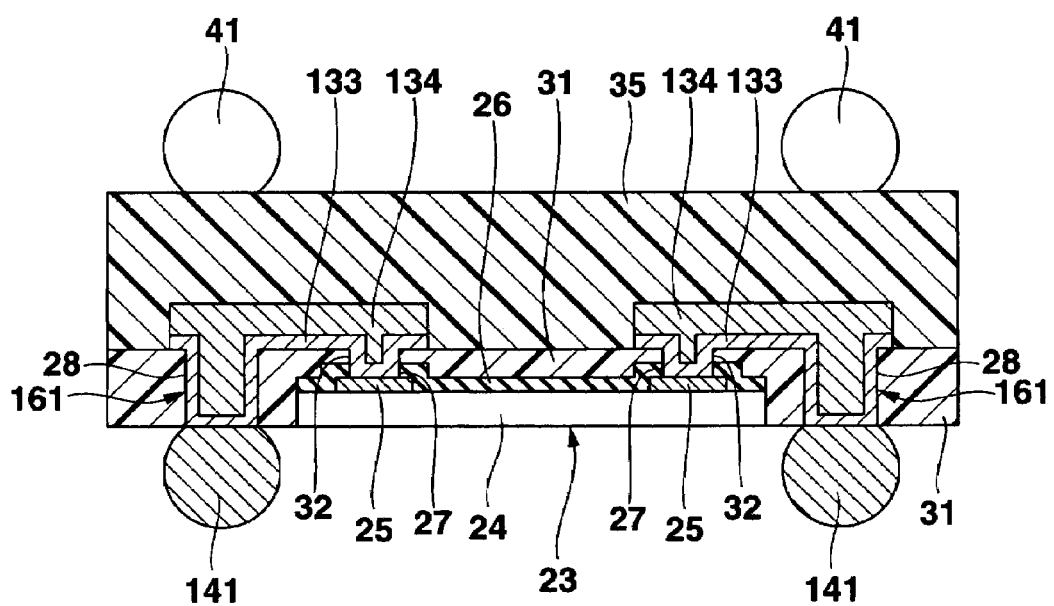
FIG. 27 is a cross sectional view showing in a magnified fashion the semiconductor device shown in FIG. 26 along the line XXVII—XXVII shown in FIG. 26.
Figure 28:
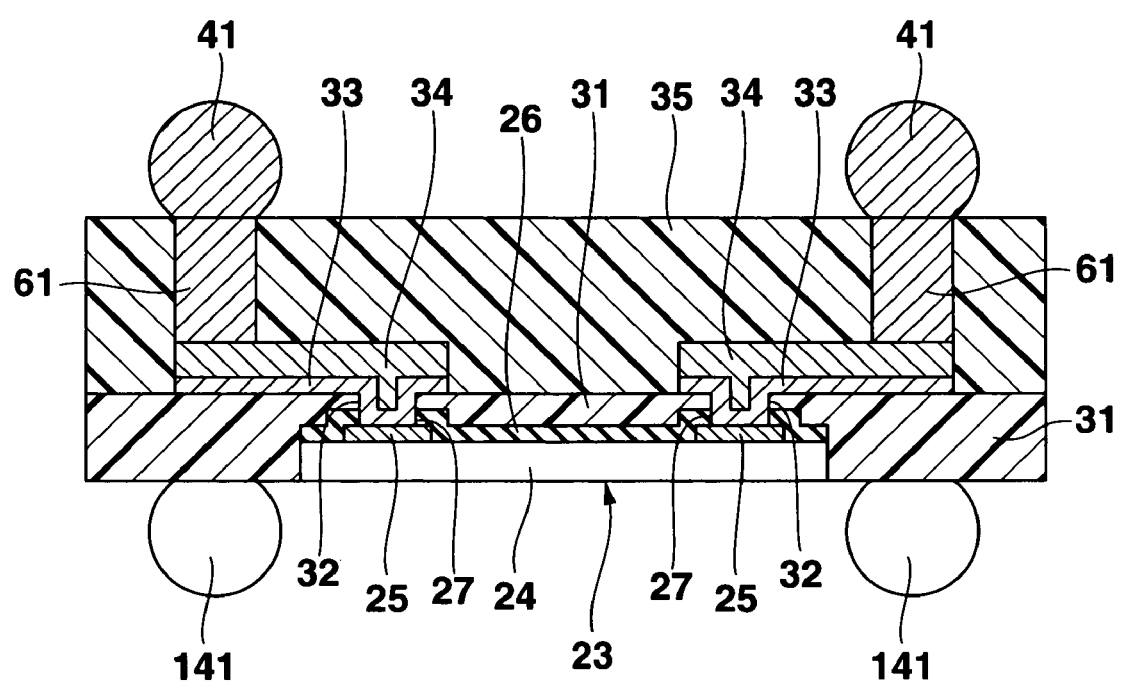
FIG. 28 is a cross sectional view showing in a magnified fashion the semiconductor device shown in FIG. 26 along the line XXVIII—XXVIII shown in FIG. 26.

FIGS. 26 to 28 collectively show a semiconductor device according to a ninth embodiment of the present invention, wherein FIG. 26 is a plan view of the semiconductor device, FIG. 27 is a lateral cross sectional view along the line XXVII—XXVII shown in FIG. 26 showing the state of the wiring on the back surface of the semiconductor device shown in FIG. 26, and FIG. 28 is a vertical cross sectional view along the line XXVIII—XXVIII shown in FIG. 26 showing the state of the wiring on the front surface of the semiconductor device shown in FIG. 26. As shown in the figures, the semiconductor device according to the ninth embodiment of the present invention comprises a semiconductor chip 23 formed of, for example, an LSI. The semiconductor chip 23 is constructed such that a plurality of connection pads 25 are formed in the peripheral portion on the upper surface of, for example, a silicon substrate 24, an insulating film 26 made of an inorganic material such as silicon oxide is formed on the upper surface of the silicon substrate 24 excluding the central portion of the connection pad 25, and the central portion of the connection pad 25 is exposed to the outside through an open portion 27 formed in the insulating film 26.

A first insulating film 31 made of an organic material such as a polyimide-based resin, an epoxy-based resin or a PBO (benzoxazole)-based resin is formed on the upper surface of the semiconductor chip 23 and the periphery thereof. The first insulating film 31 has a flat upper surface, and the lower surface of the first insulating film 31 is flush with the lower surface of the silicon substrate 24. In this case, an open portion 32 is formed in that portion of the first insulating film 31 which corresponds to the open portion 27 of the insulating film 26. Also, through-holes 28 are formed in a plurality of prescribed portions of the first insulating film 31 around the semiconductor chip 23.

As shown in FIGS. 26 and 28, first underlying metal layers 33 are formed to extend from the upper surfaces of the connection pads 25 arranged on a pair of mutually facing sides of the semiconductor chip 23 and exposed to the outside through the open portions 27, 32 to reach prescribed positions on the upper surface of the first insulating film 31. A first re-wiring 34 is formed on the upper surface of the first underlying metal layer 33. Also, a columnar electrode 61 is formed on the pad portion of the first re-wiring 34. Further, a solder ball 41 is formed on the upper surface of the columnar electrode 61.

Also, as shown in FIGS. 26 and 27, a plurality of through-holes 28 extending from the upper surface to the lower surface of the first insulating film 31 are formed in the first insulating film 31 formed on a pair of mutually facing other sides of the semiconductor chip 23. Further, fourth underlying metal layers 133 are formed to extend from the upper surfaces of the connection pads 25 exposed to the outside through the open portions 27, 32 to reach the upper surface of the first insulating film 31 and the inner wall surface and the bottom surface of the through-hole 28. In this case, the lower surface of the fourth underlying metal layer 133 formed in the inner bottom portion of the through-hole 28 is flush with the lower surface of the first insulating film 31. Also, a fourth re-wiring 134 is formed on the upper surface of the fourth underlying metal layer 133.

It should be noted that the fourth underlying metal layer 133 and the fourth re-wiring 134 arranged within the through-hole 28 collectively form an electrode 161 performing the function of a connection terminal section connected to an external circuit. It follows that only that portion of the fourth re-wiring 134 which is positioned on the first insulating film 31 constitutes a wiring portion performing the connecting function. Further, a solder ball 141 is formed on the lower surface of the fourth underlying metal layer 133 formed in the inner bottom portion of the through-hole 28, i.e., on the lower surface of the electrode 161.

As shown in FIGS. 27 and 28, a second insulating film 35 made of an organic material such as a polyimide-based resin, an epoxy-based resin or a PBO-based resin is formed on the upper surface of the first insulating film 31 including the first re-wirings 34 and the fourth re-wirings 134 and excluding the columnar electrodes 61. The second insulating film 35 is formed such that the upper surface of the second insulating film 35 is rendered flush with the upper surface of the columnar electrodes 61.

As described above, in the semiconductor device according to the ninth embodiment of the present invention, the columnar electrode 61 and the solder ball 41 connected to the columnar electrode 61 are formed on the upper side, and the electrode 161 and the solder ball 141 connected to the electrode 161 are formed on the lower side. It follows that it is possible to bond the solder ball 41 on one side of the semiconductor device to a circuit substrate or another electronic past and to bond the solder ball 141 on the other side to another circuit substrate or electronic part. As a result, a connector required in the past is rendered unnecessary so as to make the present invention advantageous in terms of the manufacturing efficiency and the manufacturing cost. In addition, the present invention makes it possible to improve the mounting density. What should also be noted is that, in the ninth embodiment described above, the solder balls 41 and 141 on the upper and lower sides are arranged in the outer circumferential portion of the semiconductor chip 23 so as to increase the pitch between the adjacent solder balls 41 and the pitch between the adjacent solder balls 141. It follows that, even in the case where the pitch of the connection pads 25 of the semiconductor chip 23 is small, it is possible to prevent the short-circuiting between the connecting sections. In the ninth embodiment described above, the solder balls 41 formed on the upper surface of the semiconductor device are arranged to form a single row along the outer periphery of the semiconductor chip 23. Likewise, the solder balls 141 formed on the lower surface of the semiconductor device are arranged to form a single row along the outer periphery of the semiconductor chip 23. However, it is also possible to arrange each of the solder balls 41 and the solder balls 141 to form a plurality of rows. Also, it is possible for each of the solder balls 41 and the solder balls 141 formed on the upper and lower sides of the semiconductor device to be arranged not only in the outer peripheral portion of the semiconductor chip 23 but also on the region corresponding to the semiconductor chip 23. For example, these solder balls 41 and solder balls 141 can be arranged to form a matrix.

In the embodiment shown in FIGS. 26, 27 and 28, the semiconductor device comprises the solder balls 41 and the other solder balls 141 formed on the upper and lower sides of the semiconductor chip 23, respectively. However, the actual bonding is performed in general for a single side and, thus, it is possible for the solder balls arranged on the other side to obstruct the bonding operation. In such a case, it is advisable to form the solder balls on one side alone and, after completion of the bonding on said one side, to form the additional solder balls on the other side for performing the additional bonding operation.

Figure 29:
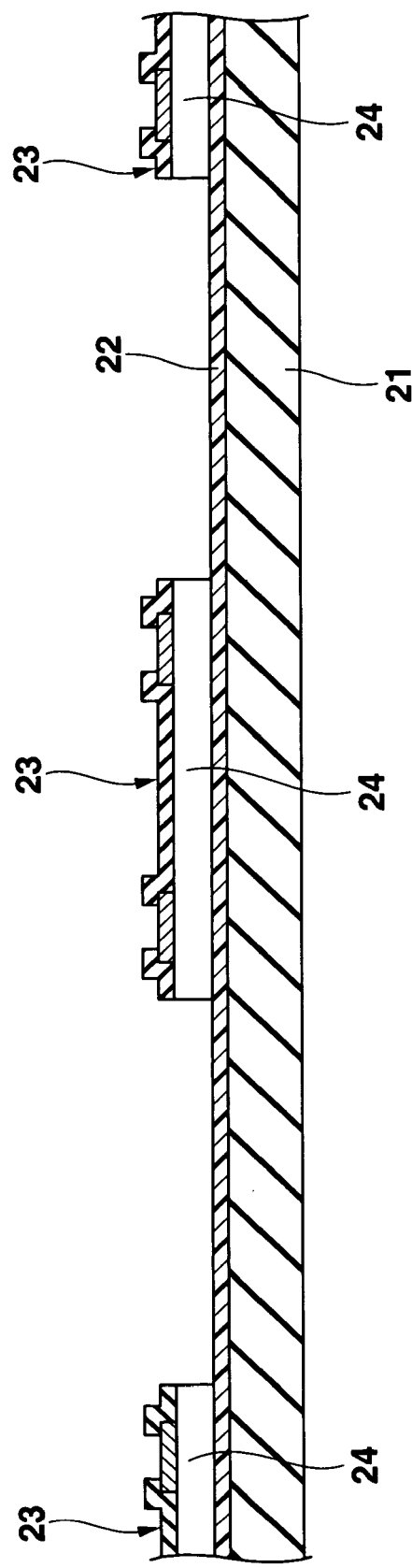
FIG. 29 is a cross sectional view showing in a magnified fashion the gist portion for describing the initial manufacturing step in an example of the manufacturing method of the semiconductor device shown in FIGS. 26, 27 and 28.

An example of the method for manufacturing the semiconductor device according to the ninth embodiment of the present invention will now be described. In the first step, prepared is a substrate structure including the base plate 21 formed of, for example, a glass plate transparent to an ultraviolet light, a transparent metal plate, or a transparent resin plate and the adhesive layer 22 formed on the upper surface of the base plate 21 and having the adhesive force lowered by the irradiation with an ultraviolet light, as shown in FIG. 29. Then, the lower surfaces of silicon substrates 24 constituting the semiconductor chips 23 are bonded to a plurality of prescribed positions on the upper surface of the adhesive layer 22. Incidentally, in the figures referred to in the following description of the manufacturing method of the semiconductor device, the region of the central semiconductor chip 23 corresponds to the cross section along the line XXVII—XXVII shown in FIG. 26, and the regions of the semiconductor chips 23 on the both sides correspond to the cross section along the line XXVIII—XXVIII shown in FIG. 26.

Figure 30:
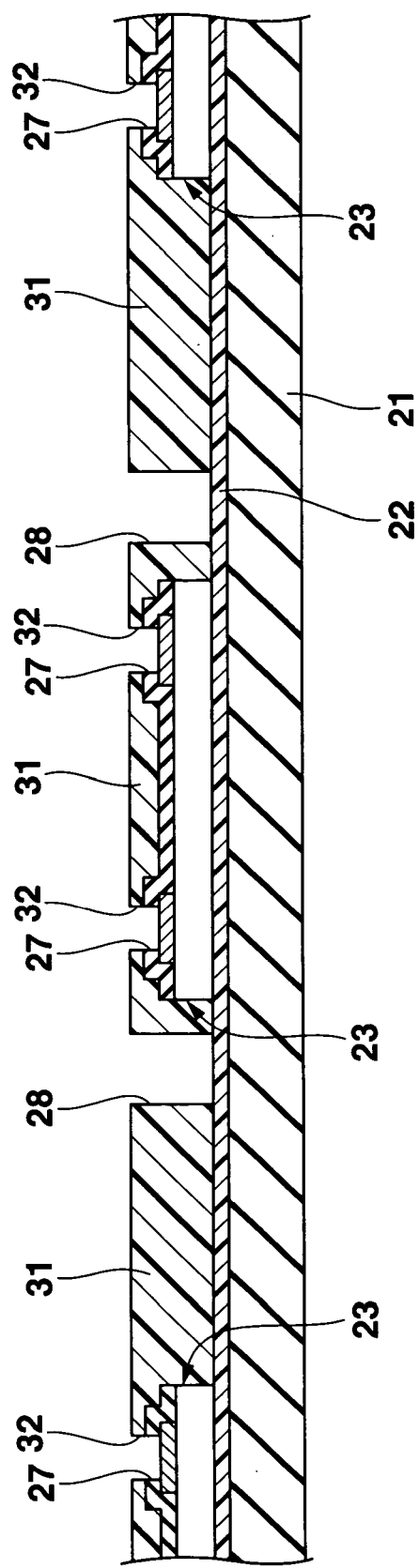
FIG. 30 is a cross sectional view showing in a magnified fashion the gist portion of the manufacturing step following the manufacturing step shown in FIG. 29.

In the next step, the upper surface of the adhesive layer 22 including the plural semiconductor chips 23 is coated with a first insulating film 31 made of an organic material such as a polyimide-based resin, an epoxy-based resin or a PBO-based resin by, for example, a spin coating method or a screen printing method, as shown in FIG. 30, followed by drying the first insulating film 31 and subsequently coating the first insulating film 31 with a photoresist. Further, the first insulating film 31 is patterned together with the coated photoresist by a photolithography method, as shown in FIG. 30. It should be noted that the first insulating film 31 has a flat surface and is patterned such that an open portion 32 is formed in that portion of the first insulating film 31 which corresponds to the open portion 27 of the semiconductor chip 23, and through-holes 28 are formed in a plurality of prescribed portions of the first insulating film 31 around the central semiconductor chip 23. After the patterning of the first insulating film 31, the photoresist is peeled off.

Figure 31:
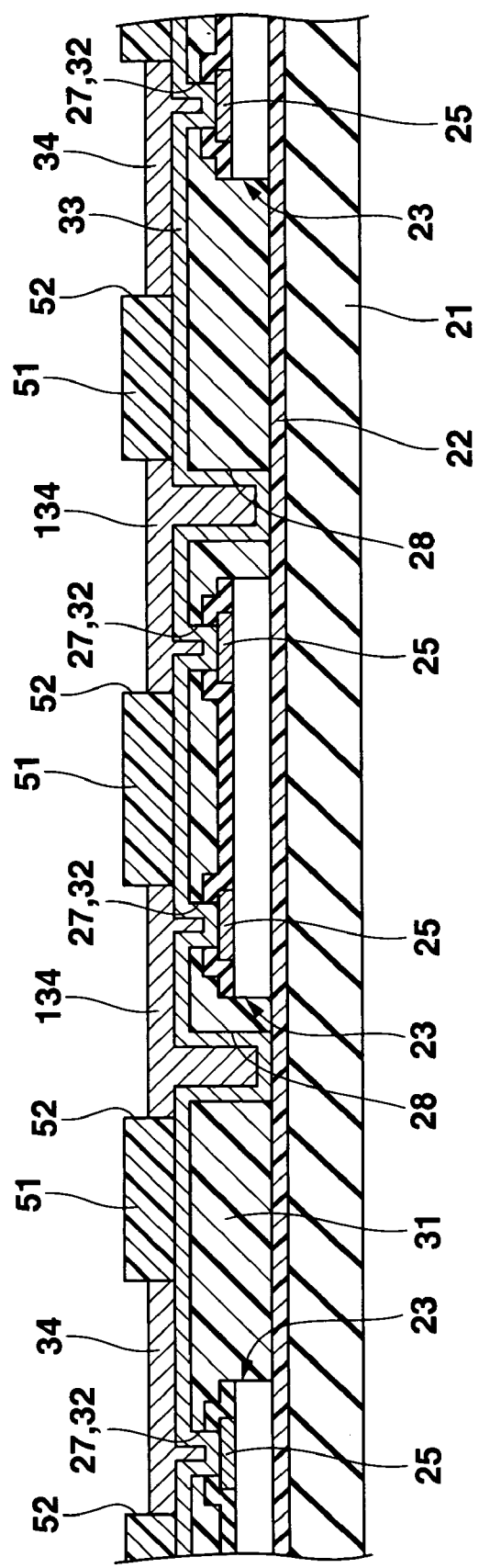
FIG. 31 is a cross sectional view showing in a magnified fashion the gist portion of the manufacturing step following the manufacturing step shown in FIG. 30.

In the next step, an underlying metal layer 33 (including an underlying metal layer 133) is formed within the through-holes 28 and on the upper surface of the first insulating film 31 including the upper surfaces of the connection pads 25 exposed to the outside through the open portions 27 and 32, as shown in FIG. 31. It is possible for the underlying metal layer 33 (including the underlying metal layer 133) to consist of a copper layer alone formed by a sputtering method or to consist of a laminate structure including a thin film layer such as a titanium layer formed by the sputtering method and a copper layer formed on the thin film layer by the sputtering method.

In the next step, a plating resist film 51 is formed on the upper surface of the underlying metal layer 33 (including the underlying metal layer 133), followed by patterning the plating resist film 51. In this case, open portions 52 are formed in those portions of the plating resist film 51 which correspond to the regions for forming re-wiring layers 34 and 134. Then, first and fourth re-wirings 34 and 134 are formed on the upper surface of the underlying metal layer 33 (including the underlying metal layer 133) within the open portions 52 of the plating resist film 51 by the electroplating of, for example, copper with the underlying metal layer 33 (including the underlying metal layer 133) used as a plating current passageway. By this electroplating, an electrode 161 constructed by the underlying metal layer 133 and the fourth re-wiring 134 is formed within the through-hole 28. Then, the plating resist film 51 is peeled off.

Figure 32:
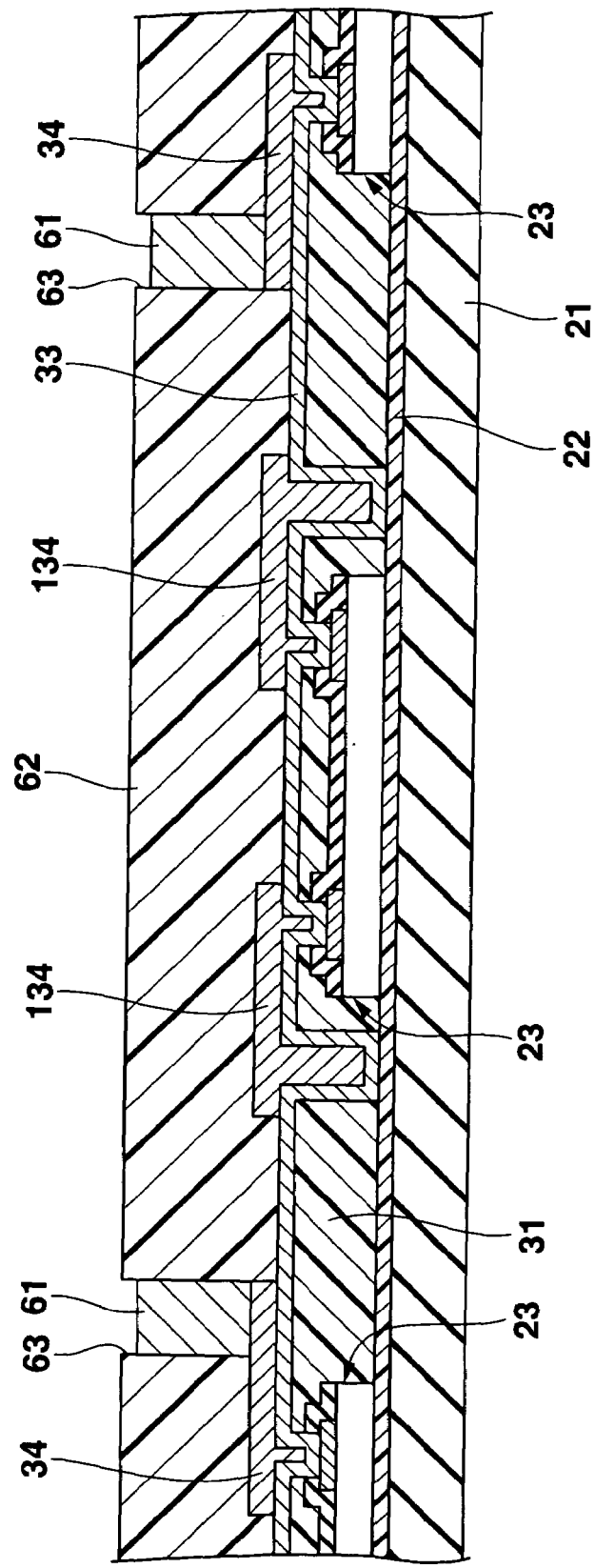
FIG. 32 is a cross sectional view showing in a magnified fashion the gist portion of the manufacturing step following the manufacturing step shown in FIG. 31.

In the next step, a plating resist film 62 is formed on the upper surface of the underlying metal layer 33 including the first and second re-wirings 34 and 134, as shown in FIG. 32. In this case, an open portion 63 is formed in that portion of the plating resist film 62 which corresponds to the pad portion of the first re-wiring 34. Then, a columnar electrode 61 is formed in a height of about 100 to 150 μm on the upper surface of the pad portion of the first re-wiring 34 within the open portion 37 of the plating resist film 36 by the electroplating of, for example, copper with the underlying metal layer 33 (including the underlying metal layer 133) used as the plating current passageway. After the electroplating step, the plating resist film 62 is peeled off.

Figure 33:
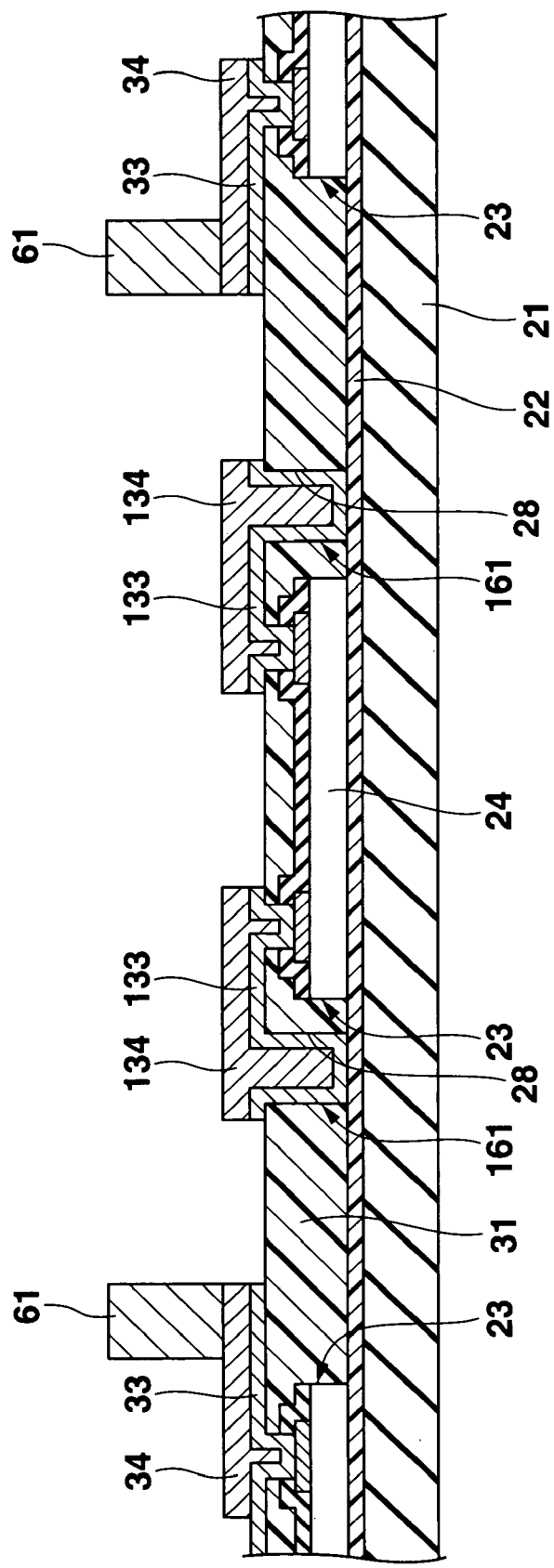
FIG. 33 is a cross sectional view showing in a magnified fashion the gist portion of the manufacturing step following the manufacturing step shown in FIG. 32.
Figure 34:
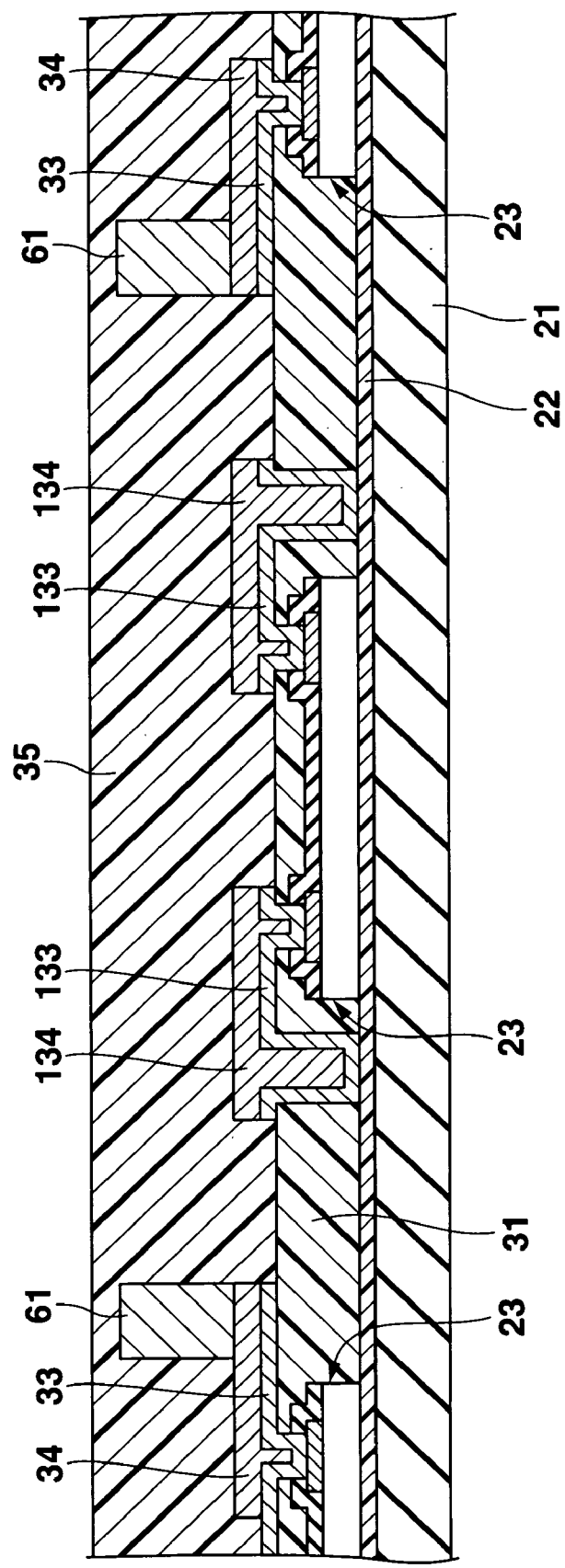
FIG. 34 is a cross sectional view showing in a magnified fashion the gist portion of the manufacturing step following the manufacturing step shown in FIG. 33.

In the next step, the undesired portion of the underlying metal layer 33 is removed by the etching with the first and fourth re-wirings 34 and 134 used as a mask. In this case, the first and fourth re-wirings 34 and 134 used as a mask are also etched simultaneously. However, since these first and fourth re-wirings 34 and 134 are markedly thicker than the underlying metal layer 33, the first and fourth re-wirings 34 and 134 alone are left unremoved if the etching treatment is stopped at the time when the etching of the underlying metal layer 33 is finished. It follows that the first and fourth underlying metal layers 33 and 133 are left unremoved only below the first and fourth re-wirings 34 and 134, respectively, as shown in FIG. 33. The fourth underlying metal layer 133 and the fourth re-wiring 134 formed within the through-hole 28 collectively form an electrode 161. Concerning an example of the height of the electrode 161, the height of the electrode 161 is basically equal to the sum of the thickness of the semiconductor chip 23 and the thickness of the first insulating film 31 positioned on the semiconductor chip 23. The thickness of the semiconductor chip 23 is about 20 to 70 μm, and the thickness of that portion of the first insulating film 31 which is positioned on the semiconductor chip 23 is about 10 μm. It follows that the height of electrode 161 is about 30 to 80 μm, which is smaller than the height of the columnar electrode 61, which is about 100 to 150 μm. However, the relationship between the height of the electrode 161 and the height of the columnar electrode 61 is not limited to the example given above.

Figure 35:
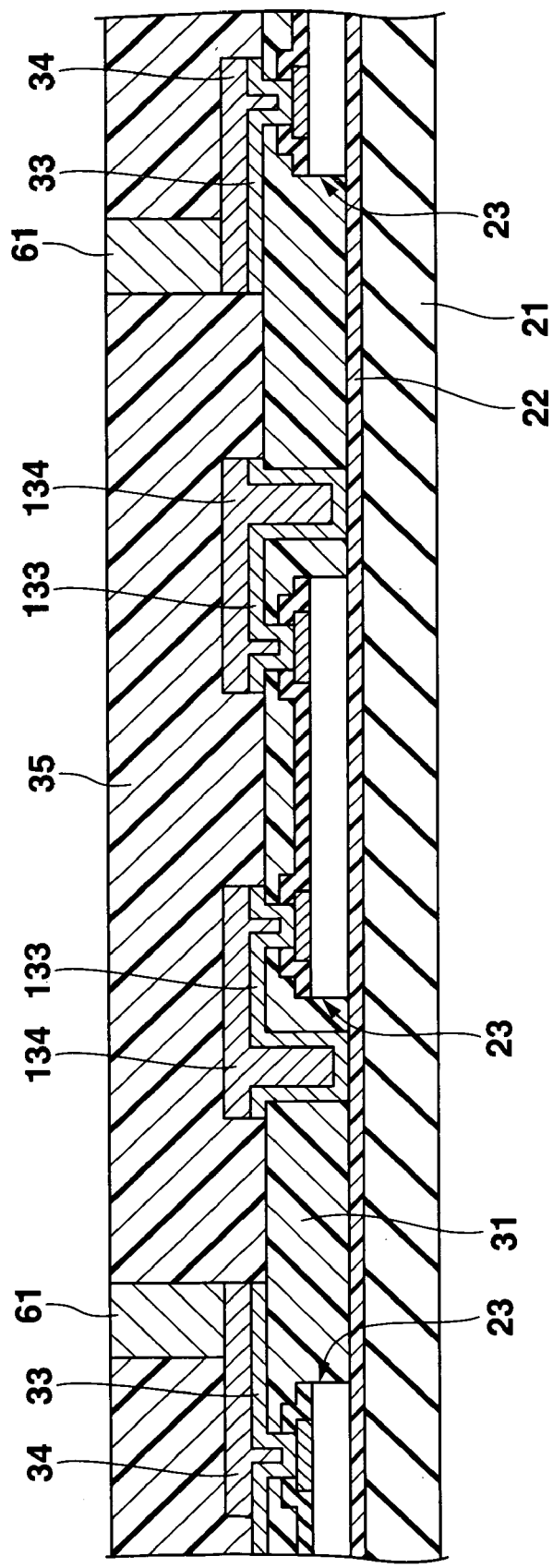
FIG. 35 is a cross sectional view showing in a magnified fashion the gist portion of the manufacturing step following the manufacturing step shown in FIG. 34.
Figure 36:
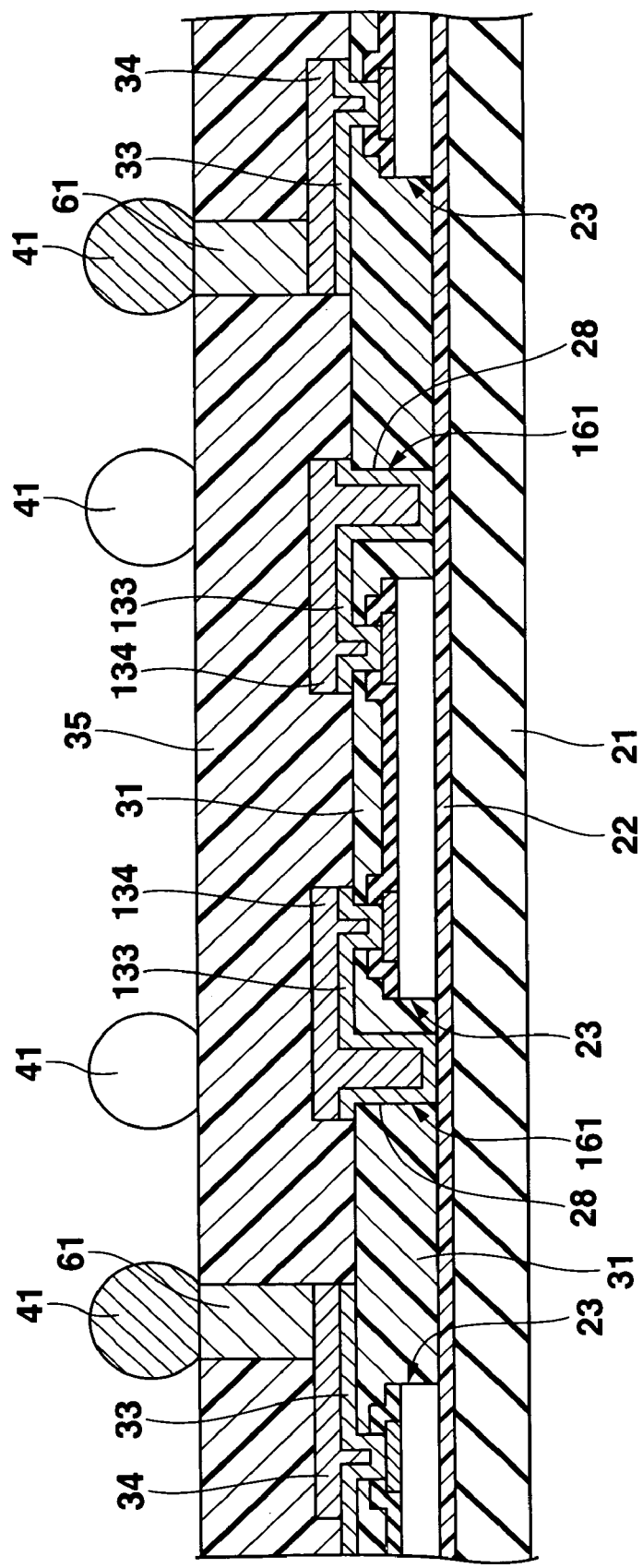
FIG. 36 is a cross sectional view showing in a magnified fashion the gist portion of the manufacturing step following the manufacturing step shown in FIG. 35.

In the next step, a second insulating film 35 made of an organic material such as a polyimide-based resin, an epoxy-based resin or a PBO-based resin is formed on the upper surface of the first insulating film 31 including the columnar electrodes 61 and the first and fourth re-wirings 34, 134 by, for example, a dispenser method, a printing method or a transfer molding method such that the thickness of the second insulating film 35 is somewhat larger than the height of the columnar electrode 61. It follows that, under the state noted above, the upper surface of the columnar electrode 61 is covered with the second insulating film 35. Then, the upper surface of the second insulating film 35 is polished appropriately so as to expose the upper surface of the columnar electrode 61 to the outside, as shown in FIG. 35. Further, a solder ball 41 is formed on the upper surface of the columnar electrode 61, as shown in FIG. 36. The solder ball 41 can be formed by, for example, sucking the solder ball 41 by using a sucking device so as to dispose the solder ball 41 on the columnar electrode 61, followed by allowing the solder ball 41 to reflow. It is also possible to have the upper surface of the columnar electrode 61 covered with a solder layer by, for example, a printing method, followed by forming the solder ball 41 by means of the reflowing.

Figure 37:
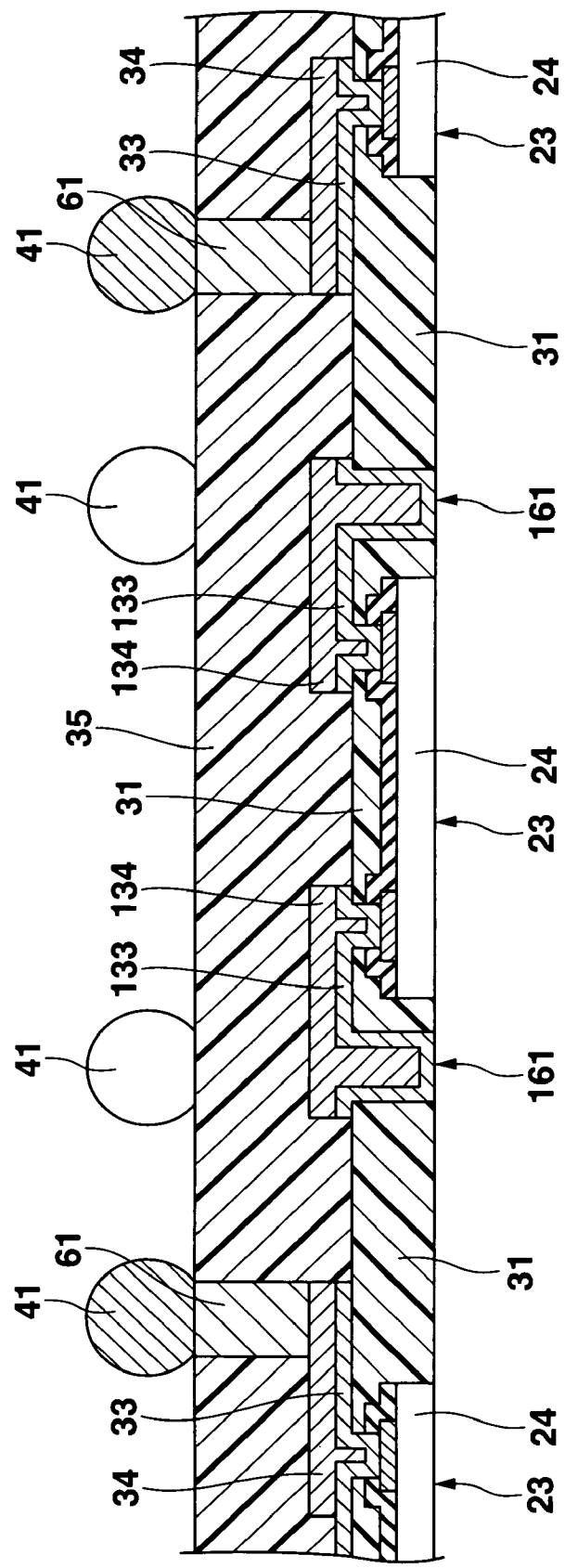
FIG. 37 is a cross sectional view showing in a magnified fashion the gist portion of the manufacturing step following the manufacturing step shown in FIG. 36.

In the next step, the base plate 21 is irradiated with an ultraviolet light emitted from below the base plate 21 so as to lower the adhesive force of the adhesive layer 22. Under this condition, the base plate 21 and the adhesive layer 22 are peeled off, as shown in FIG. 37. Under this state, the lower surface of the first insulating film 31 and the lower surface of the electrode 161 are flush with the lower surface of the silicon substrate 24. If an adhesive or a foreign matter is attached to the lower surface of the electrode 161 in this stage, the adhesive or the foreign matter are removed from the lower surface of the electrode 161 by means of, for example, a plasma etching.

Figure 38:
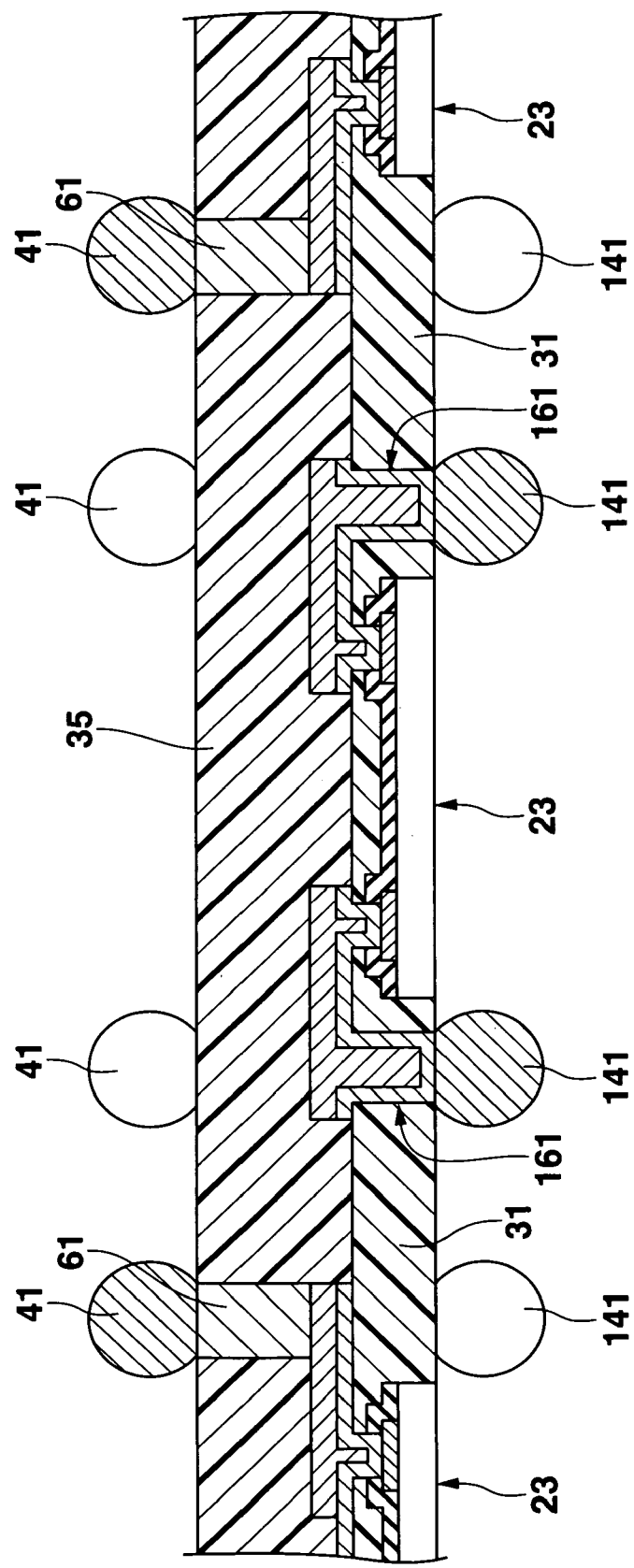
FIG. 38 is a cross sectional view showing in a magnified fashion the gist portion of the manufacturing step following the manufacturing step shown in FIG. 37.
Figure 39:
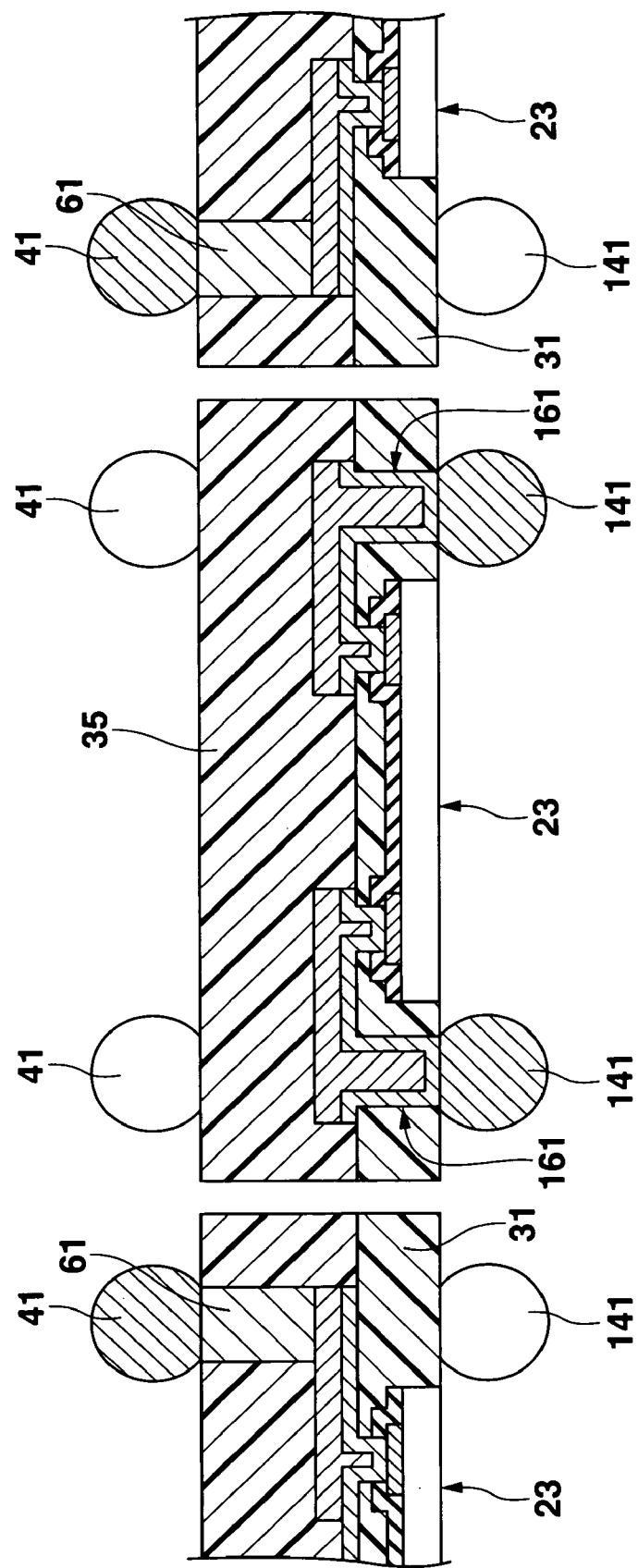
FIG. 39 is a cross sectional view showing in a magnified fashion the gist portion of the manufacturing step following the manufacturing step shown in FIG. 38.

In the next step, a solder ball 141 is formed on the lower surface of the electrode 161, as shown in FIG. 38. Then, if a laminate structure constructed by the first insulating film 31 and the second insulating film 35 is cut in a region between the adjacent semiconductor chips 23 as shown in FIG. 39, obtained are a plurality of semiconductor devices each constructed as shown in FIGS. 26, 27 and 28.

(Tenth Embodiment)

Figure 40:
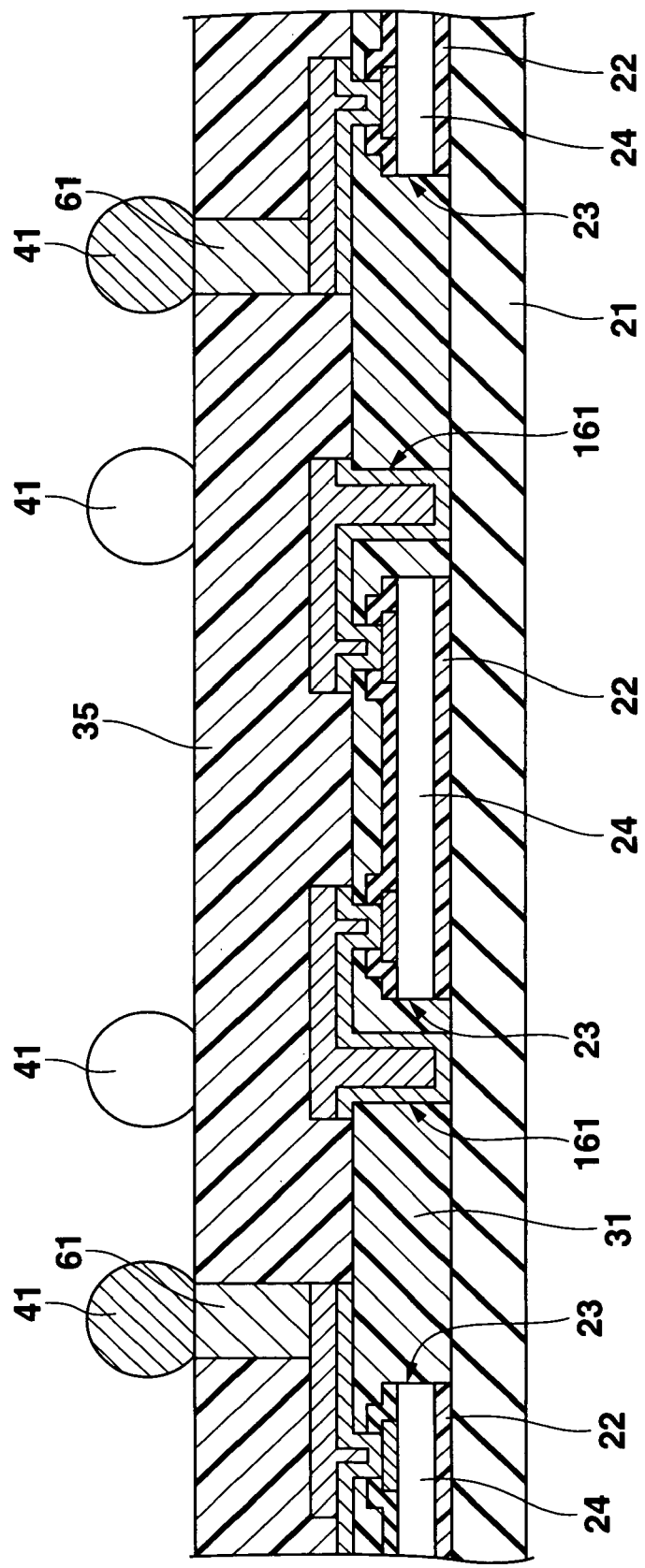
FIG. 40 is a cross sectional view showing in a magnified fashion the gist portion of a semiconductor device according to a tenth embodiment of the present invention.

In the ninth embodiment described above, the adhesive layer 22 is formed on the entire upper surface of the base plate 21, as shown in FIG. 36. Alternatively, it is also possible to form the adhesive layer 22 only on the lower surface of the silicon substrate 24 of the semiconductor chip 23 so as to permit the silicon substrate 24 to be bonded to the base plate 21 as in a tenth embodiment of the present invention, which is shown in FIG. 40. In this case, however, if the base plate 21 and the adhesive layer 22 are peeled off, the lower surface of the first insulating film 31 and the lower surface of the electrode 161 are caused to protrude downward from the lower surface of the silicon substrate 24. Such being the situation, it is possible to remove appropriately the protruding portion by the polishing, if necessary, in the mounting step of the semiconductor chip to the circuit substrate. Alternatively, it is possible to use, for example, a dicing tape, which is stretched out so as to be peeled from, for example, the silicon substrate 24, in place of the adhesive layer 22.

(Eleventh Embodiment)

Figure 41:
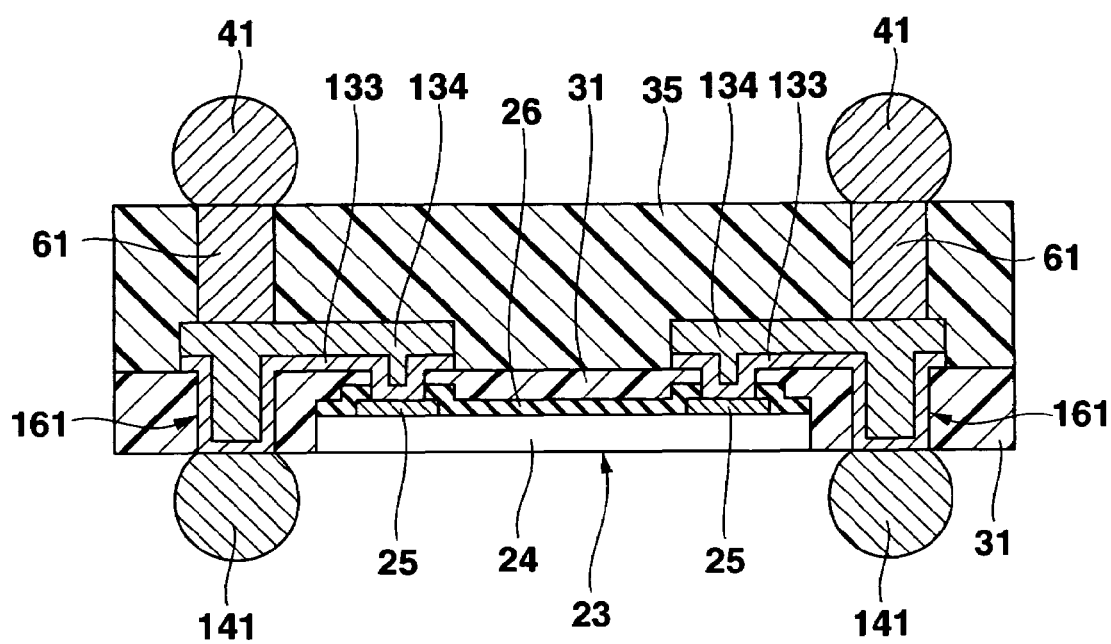
FIG. 41 is a cross sectional view showing in a magnified fashion the gist portion of a semiconductor device according to an eleventh embodiment of the present invention.

Also, in the ninth embodiment described above, the columnar electrode 61 is formed on the pad portion of the first re-wiring 34, and the electrode 161 is formed below the pad portion of the fourth re-wiring 134. However, it is also possible to form the columnar electrode 61 on the pad portion of the fourth re-wiring 134 as in an eleventh embodiment of the present invention, which is shown in FIG. 41. In other words, in the eleventh embodiment of the present invention, the electrode 161 and the columnar electrode 61 are formed in the same position in a manner to face in the opposite directions. Also, a solder ball 141 is formed on the electrode 161, and the solder ball 41 is formed on the columnar electrode 61.

(Twelfth Embodiment)

Figure 42:
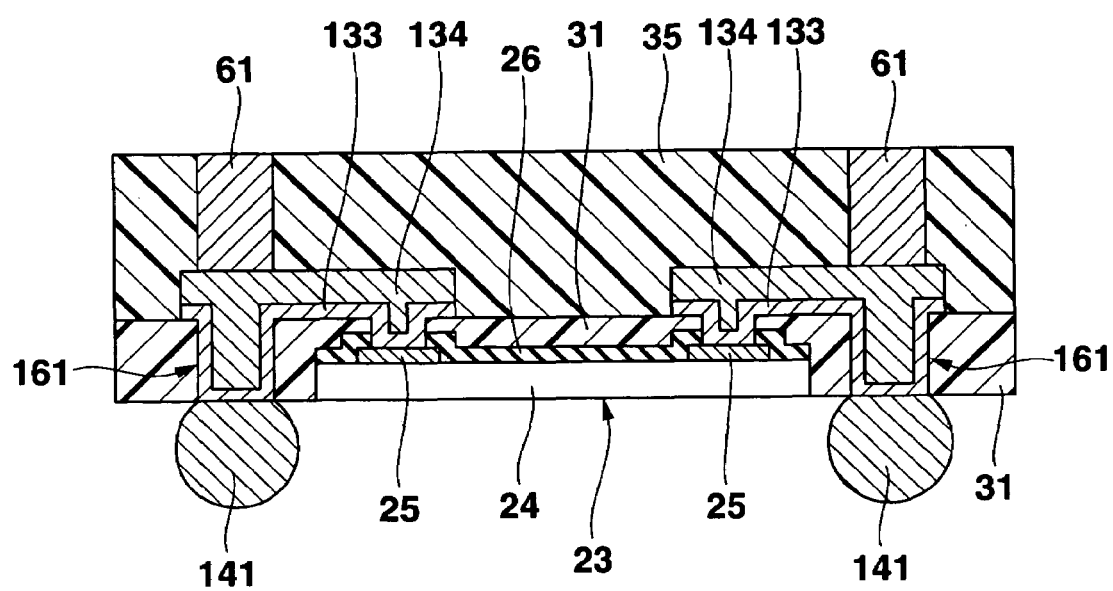
FIG. 42 is a cross sectional view showing in a magnified fashion the gist portion of a semiconductor device according to a twelfth embodiment of the present invention.

In a twelfth embodiment of the present invention, which is shown in FIG. 42, the solder ball 141 is formed on only one surface of the semiconductor device, e.g., only on the electrode 161, and the solder ball 41 as shown in FIG. 41 is not formed on the columnar electrode 61. In this case, it is possible to form the solder ball 41 (not shown) on only the columnar electrode 61 without forming the solder ball 141 on the lower surface of the electrode 161.

As a modification of the constructions shown in FIGS. 41 and 42, it is possible to form the columnar electrodes 61 as shown in FIG. 28 on only some of the first re-wirings 34, or to form the electrodes 161 as shown in FIG. 27 on only some of the fourth re-wirings 134 in place of forming the electrodes 161 or the columnar electrodes 61 on all the re-wirings.

Figure 43:
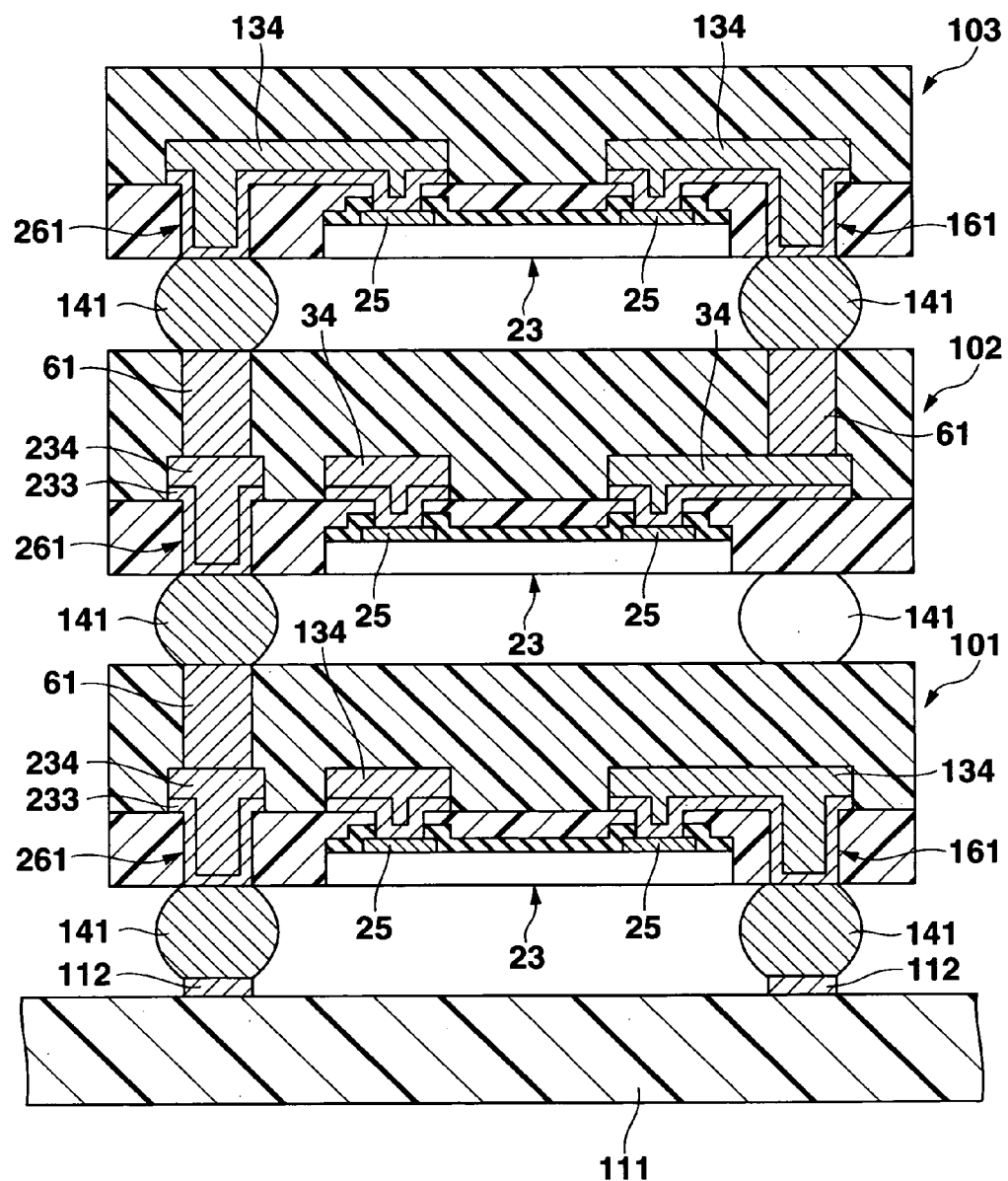
FIG. 43 is a cross sectional view showing in a magnified fashion the state that a plurality of semiconductor devices are mounted in a laminated fashion to a circuit substrate.

FIG. 43 is a cross sectional view exemplifying the case where a plurality of semiconductor devices, e.g., three semiconductor devices 101, 102, 103, are mounted on a circuit substrate 111. In this example, a solder ball 141 of the first semiconductor device 101 is bonded to a connection terminal 112 of the circuit substrate 111 so as to permit the first semiconductor device 101 to be bonded to the circuit substrate 111. Also, a solder ball 141 of the second semiconductor device 102 is bonded to a columnar electrode 61 of the first semiconductor device 101 so as to permit the second semiconductor device 102 to be directly mounted on the first semiconductor device 101. Further, a solder ball 141 of the third semiconductor device 103 is bonded to a columnar electrode 61 of the second semiconductor device 102 so as to permit the third semiconductor device 103 to be mounted on the second semiconductor device 102.

In this case, the uppermost semiconductor device, i.e., the third semiconductor device 103, comprises only a fourth re-wiring 134 and a columnar electrode 161 as shown in, for example, FIG. 27 and does not comprise a first re-wiring 34 and a columnar electrode 61. Incidentally, where four or more semiconductor devices are stacked one upon the other on the circuit substrate 111, it suffices to use as the third semiconductor device 103 a semiconductor device similar to the first semiconductor device 101 or the second semiconductor device 102.

Also, each of the first and second semiconductor devices 101 and 102 includes a plurality of projecting electrodes exclusively performing the function of a relay terminal to the third semiconductor device 103. To be more specific, an electrode 261 and the columnar electrode 61 shown on the left side in FIG. 43 are connected to each other via an underlying metal layer 233 and a relay pad portion 234 under a floating state, which are not connected to any of the connection pads 25 of the semiconductor chip 23 housed in the semiconductor device. In this case, a control signal of the third semiconductor device 103 such as a select signal or a reset signal is supplied to the connection terminal 112, which is shown on the left side of FIG. 43, of the circuit substrate 111 connected to the electrode 261 performing the function of the relay terminal.

Figure 44:
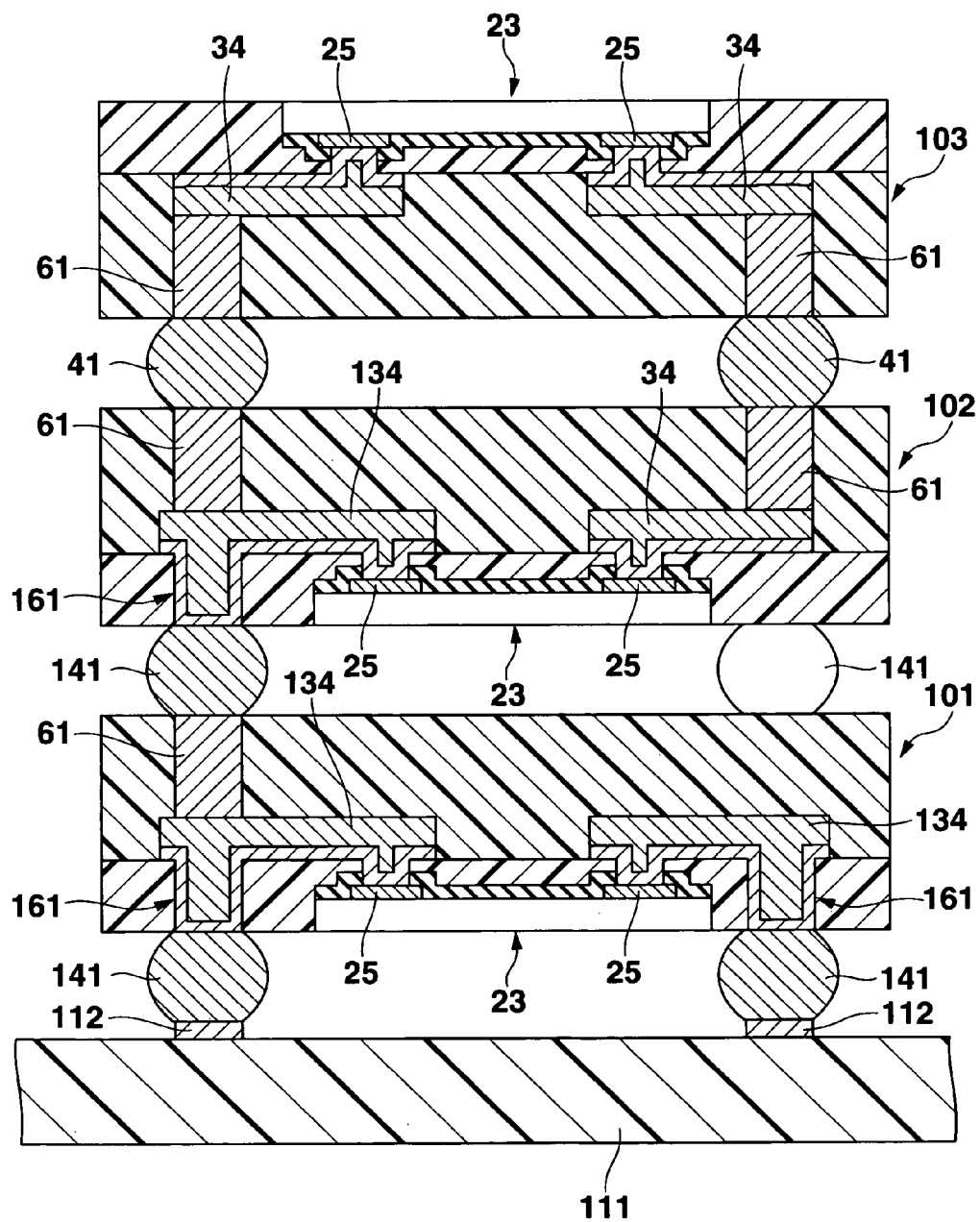
FIG. 44 is a cross sectional view showing in a magnified fashion another example for mounting a plurality of semiconductor devices in a laminated fashion to a circuit substrate.
Figure 45:
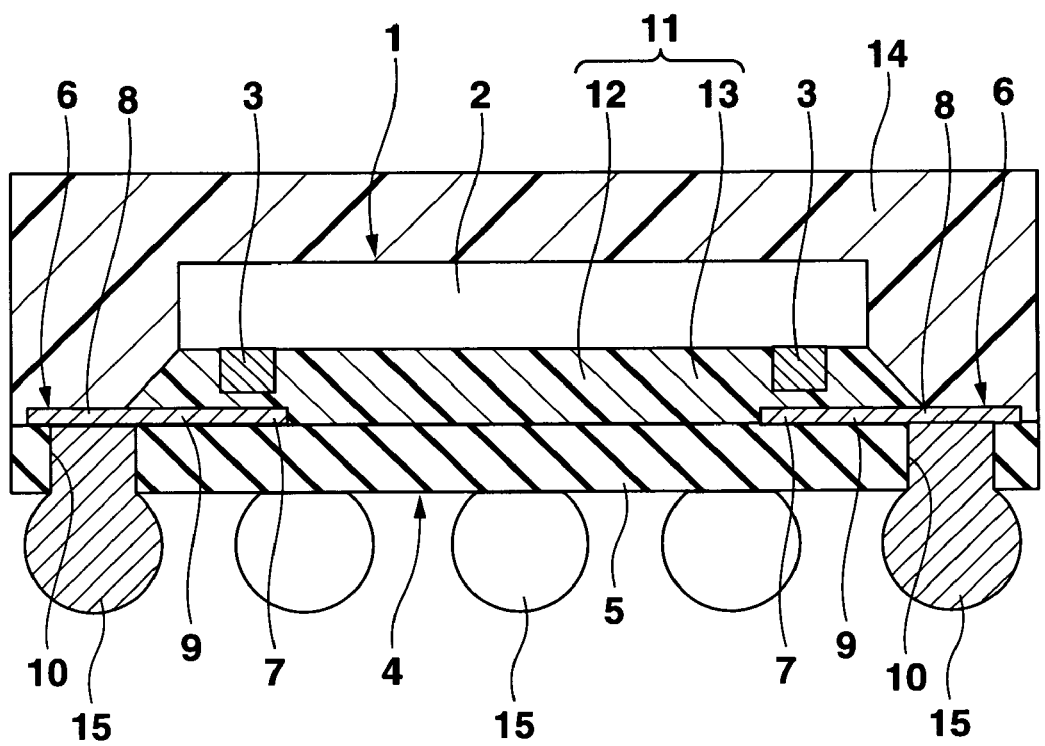
FIG. 45 is a cross sectional view showing in a magnified fashion a conventional semiconductor device.

FIG. 44 shows another example of the semiconductor device. Where the connection terminal 112 of the circuit substrate 111 on the left side of the drawing constitutes a GND terminal, it is possible to form the columnar electrode 61 on the pad portion of the first re-wiring 134 on the left side in each of the first and second semiconductor devices 101 and 102. In this case, however, the third semiconductor device 103 includes only the first re-wiring 34 and the columnar electrode 61 as shown in, for example, FIG. 28 and does not include the fourth re-wiring 134 and the electrode 161. Also, the solder ball 41 for connecting the columnar electrode 61 of the second semiconductor device 102 to the columnar electrode 61 of the third semiconductor device 103 is formed in advance on the upper surface of the columnar electrode 61 of the second semiconductor device 102 or on the lower surface of the columnar electrode 61 of the third semiconductor device 103.

Further, it is advisable to form in advance the solder ball 141 on each of the lower surface of the electrode 161 and the upper surface of the columnar electrode 61 in, for example, FIG. 44. In this case, it is possible to increase slightly the height of the solder ball 141 bonded to the connection terminal 112 of the circuit substrate 111 and to decrease slightly the height of the solder ball 141 bonded to the electrode 161 of the second semiconductor device 102 depending on the mounting mode of the semiconductor device.

Incidentally, in FIGS. 26, 27 and 28, the electrodes 161 are arranged on a pair of mutually facing sides of the semiconductor chip 23, and the columnar electrodes 61 are arranged on another pair of mutually facing sides of the semiconductor chip 23. Alternatively, it is possible to arrange each of the electrodes 161 and the columnar electrodes 61 on the adjacent sides of the semiconductor chip 23 or on all the sides of the semiconductor chip 23. Also, in order to render the semiconductor device oblong for facilitating the mounting of the semiconductor device to an electronic device, it is possible to arrange the electrodes 161 and the columnar electrodes 61 on only a pair of mutually facing sides of the semiconductor chip such that these electrodes are not arranged on the other sides of the semiconductor chip. Further, in order to make uniform the load applied to each of the projecting electrodes in the bonding step, it is possible to form a dummy electrode that is not connected to any of the connection pads of the semiconductor chip housed in each semiconductor device or a dummy electrode connected to the connection pad commonly with the other columnar electrodes. Still further, in the semiconductor chip housed in each of the semiconductor devices, the bottom surface of the electrode 161 is exposed to the outside, and the solder ball 141 is bonded to the exposed bottom surface of the electrode 161. Alternatively, it is possible to cover the bottom surface of the semiconductor chip with an insulating film (sealing material) and to form through-holes in those regions of the insulating film which correspond to the electrodes 161. In this case, it is possible to apply plating to the wall defining the through-hole for the bonding of the solder ball 141, if necessary. Accordingly, various modifications may be made without departing from the spirit or scope of the general inventive concept as defined by the appended claims and their equivalents.

As described above, the present invention provides a semiconductor device comprising at least one semiconductor chip having a connection pad formed on the upper surface, an insulating film of at least a single layer structure formed to cover one surface and the peripheral surface of the semiconductor chip, and a re-wiring formed on the upper surface of the insulating film so as to be connected to the connection pad of the semiconductor chip. Since at least a part of the re-wiring has a pad portion arranged in the region of the insulating film around the semiconductor chip, it is unnecessary to employ the bonding step required in the prior art. As a result, the semiconductor chip can be connected to the re-wiring without fail so as to eliminate the occurrence of the defective connection. Also, since the insulating film and the re-wiring can be collectively formed for a plurality of semiconductor chips or for a plurality of sets of semiconductor chips, the manufacturing process can be simplified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor device comprising:
   at least one semiconductor chip having a plurality of connection pads formed on an upper surface thereof;
   a lower layer including at least an insulating film of at least one layer formed to cover the upper surface and a peripheral surface of the semiconductor chip; and
   re-wirings formed on an upper surface of the insulating film in a manner to be electrically connected to the connection pads, of the semiconductor chip;
   each of at least some off the re-wirings including a pad portion arranged in a region of the insulating film, outside the semiconductor chip,
   wherein the lower layer has a lower surface opposing the upper surface thereof and is provided with a through-hole positioned outside the lateral extent of the semiconductor chip and extending from the upper surface to the lower surface of the lower layer, an electrode being formed within the through-hole.

2. The semiconductor device according to claim 1, wherein the electrode is a part of the re-wiring.

3. The semiconductor device according to claim 1, wherein a columnar electrode is formed on a portion of one of the re-wirings proximate to where the electrode is formed in the through-hole.

4. The semiconductor device according to claim 1, wherein the lower layer is provided with throughholes corresponding to some of the lower re-wirings, electrodes which are connected to the lower re-wirings being formed in the through-holes, and columnar electrodes being formed on at least some of the remaining re-wirings.

5. A semiconductor device according to claim 4, wherein the insulating film includes an upper layer covering the periphery of the columnar electrode and a lower layer formed under the upper layer.

6. The semiconductor device according to claim 1, further comprising an electrode that is not electrically connected to the connection pad.

7. The semiconductor device according to claim 1, further comprising at least one electronic part provided with a connection terminal and a connecting member for electrically connecting the electrode formed within the through-hole to the connection terminal of the electronic part.

8. The semiconductor device according to claim 7, wherein the electronic part comprises at least one another semiconductor chip having a connection pad formed on an upper surface thereof, an insulating film having at least one layer formed in a manner to cover one surface and a periphery of the another semiconductor chip, a re-wiring formed on an upper surface of the insulating film so as to be connected to the connection pad of the another semiconductor chip, and an electrode formed on the re-wiring.

9. The semiconductor device according to claim 8, wherein the electrode of the at least one electric part is a columnar electrode.

10. The semiconductor device according to claim 8, wherein the lower layer of the at least one electric part is provided with a through-hole, and the electrode of the at least one electric part is formed within the through-hole.

11. The semiconductor device according to claim 10, wherein a columnar electrode protruding in a direction opposite to a protruding direction of the electrode of the at least one electric part is formed on the electrode.

12. A semiconductor device according to claim 1, wherein the semiconductor chip has a lower surface facing the upper surface, and the lower surface of the insulating film is substantially flush with the lower surface of the semiconductor chip.

13. A semiconductor device according to claim 1, wherein the re-wiring is electrically connected to the electrode, and a columnar electrode is formed on the pad portion of the re-wiring.

\* \* \* \* \*